US008853697B2

(12) United States Patent
Okazaki et al.

(10) Patent No.: US 8,853,697 B2
(45) Date of Patent: Oct. 7, 2014

(54) SEMICONDUCTOR DEVICE

(71) Applicants: Semiconductor Energy Laboratory Co., Ltd., Atsugi (JP); Sharp Kabushiki Kaisha, Osaka (JP)

(72) Inventors: Kenichi Okazaki, Tochigi (JP); Takuya Matsuo, Osaka (JP); Yoshitaka Yamamoto, Osaka (JP); Hiroshi Matsukizono, Osaka (JP); Yosuke Kanzaki, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 13/776,999

(22) Filed: Feb. 26, 2013

(65) Prior Publication Data
US 2013/0228774 A1 Sep. 5, 2013

(30) Foreign Application Priority Data

Mar. 1, 2012 (JP) ................................. 2012-045498

(51) Int. Cl.
*H01L 29/04* (2006.01)
*H01L 31/036* (2006.01)
*H01L 31/0376* (2006.01)
*H01L 31/20* (2006.01)
*H01L 29/786* (2006.01)

(52) U.S. Cl.
CPC .............................. *H01L 29/7869* (2013.01); *H01L 29/78603* (2013.01)
USPC .. 257/59; 257/72; 257/E29.117; 257/E29.273

(58) Field of Classification Search
USPC ......... 257/59, 66, 72, 347, E29.117, E29.273
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Hoai V Pham
(74) *Attorney, Agent, or Firm* — Eric J. Robinson; Robinson Intellectual Property Law Office, P.C.

(57) ABSTRACT

To inhibit a metal element contained in a glass substrate from being diffused into a gate insulating film or an oxide semiconductor film. A semiconductor device includes a glass substrate, a base insulating film formed using metal oxide over the glass substrate, a gate electrode formed over the base insulating film, a gate insulating film formed over the gate electrode, an oxide semiconductor film which is formed over the gate insulating film and overlapping with the gate electrode, and a source electrode and a drain electrode which are electrically connected to the oxide semiconductor film. In a region of the base insulating film that is present in a range of 3 nm or less from a surface of the base insulating film, the concentration of a metal element contained in the glass substrate is less than or equal to $1\times10^{18}$ atoms/cm$^3$.

21 Claims, 18 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,704,217 B2 * | 4/2014 | Yano et al. .................. 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117075 A1 | 5/2010 | Akimoto et al. |
| 2010/0136743 A1 | 6/2010 | Akimoto et al. |
| 2010/0295041 A1 | 11/2010 | Kumomi et al. |
| 2011/0095288 A1 | 4/2011 | Morosawa et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0175090 A1 | 7/2011 | Sugihara et al. |
| 2011/0180802 A1 | 7/2011 | Morosawa et al. |
| 2012/0132908 A1 | 5/2012 | Sugihara et al. |
| 2012/0280225 A1 | 11/2012 | Sakata |
| 2013/0043466 A1 | 2/2013 | Nomura et al. |
| 2013/0048977 A1 | 2/2013 | Watanabe et al. |
| 2013/0048978 A1 | 2/2013 | Watanabe et al. |
| 2013/0052799 A1 | 2/2013 | Ohki |
| 2013/0099232 A1 | 4/2013 | Cho et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-165528 A | 6/2006 |
| JP | 2006-229185 A | 8/2006 |
| JP | 2007-096055 A | 4/2007 |
| JP | 2007-123861 A | 5/2007 |
| JP | 2010-016163 | 1/2010 |
| JP | 2010-114413 A | 5/2010 |
| JP | 2010-135770 A | 6/2010 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of

(56) References Cited

OTHER PUBLICATIONS

International Electron Devices Meeting, Dec. 5, 2005, pp. 1067-1069.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1 , pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of high Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. b), Jan. 15, 2000, vol. 61, No. 3, pp. 1811-1816.

(56) References Cited

OTHER PUBLICATIONS

Janotti.A et al., "Native Point Defects in ZnO,", Phys. Rev. B (Physical Review. B), Oct. 4, 2007, vol. 76, No. 16, pp. 165202-1-165202-22.

Mo.Y et al., "Amporphous Oxide TFT Backplanes for Large Size AMOLED Displays,", IDW '08 : Proceedings of the 6th International Display Workshops, Dec. 3, 2008, pp. 581-584.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator,", Appl. Phys. Lett. (Applied Physics Letters), Sep. 1, 2003, vol. 93, No. 9, pp. 1755-1757.

\* cited by examiner

504a — 502

504b — 502

SEMICONDUCTOR DEVICE

BACKGROUND OF THE INVENTION

1. Field of the Invention

The present invention relates to a semiconductor device including an oxide semiconductor. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as a liquid crystal display device.

2. Description of the Related Art

A thin film transistor formed over a flat plate such as a glass substrate is manufactured using amorphous silicon or polycrystalline silicon, as typically seen in a liquid crystal display device. A thin film transistor manufactured using amorphous silicon has low field effect mobility but can be formed over a larger glass substrate. In contrast, a thin film transistor manufactured using crystalline silicon has high field effect mobility, but, due to a crystallization step such as laser annealing, such a transistor is not always suitable for being formed over a larger glass substrate.

In view of the foregoing, attention has been drawn to a technique by which a thin film transistor is manufactured using an oxide semiconductor, and such a transistor is applied to an electronic device or an optical device. For example, Patent Document 1 and Patent Document 2 disclose a technique by which a thin film transistor is manufactured using zinc oxide or an In—Ga—Zn—O-based oxide semiconductor as an oxide semiconductor film and such a transistor is used as a switching element or the like of an image display device.

Semiconductor characteristics of such an oxide semiconductor are significantly influenced by an oxygen concentration in the oxide semiconductor. Therefore, in order to suppress variation in the characteristics of an oxide semiconductor, it is important to suppress oxidation-reduction reaction of the oxide semiconductor and keep the oxygen concentration. Thus, mixing of moisture into an oxide semiconductor has been prevented by providing an oxide film or a nitride film mainly including silicon over the oxide semiconductor.

However, by using a silicon oxide film or a silicon nitride film, it has been difficult to satisfactorily prevent moisture from being mixed into the oxide semiconductor. In addition, if the thickness of a silicon oxide film or a silicon nitride film is increased in order to prevent penetration of moisture, stress is increased and therefore a crack is easily caused.

Moreover, there is a problem in that semiconductor characteristics of an oxide semiconductor are changed when an impurity such as alkali metal (Li, Cs, Na, or the like), alkaline earth metal (Ca, Mg, or the like), or another metal element as well as moisture are diffused into the oxide semiconductor (see, for example, Patent Document 3).

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2010-135770

SUMMARY OF THE INVENTION

It is an object of one embodiment of the present invention to inhibit a metal element contained in a glass substrate from being diffused into a gate insulating film or an oxide semiconductor film. It is another object of one embodiment of the present invention to inhibit an impurity such as water, hydrogen, or alkali metal which is contained in a glass substrate from being diffused into a gate insulating film or an oxide semiconductor film.

One embodiment of the present invention is a semiconductor device including a glass substrate, a transistor which is formed over the glass substrate and has an oxide semiconductor film, and an insulating film formed using metal oxide between the oxide semiconductor film and the glass substrate. In addition, in a region of the insulating film which is present in a range of 3 nm or less from a top surface of the insulating film, the concentration of a metal element contained in the glass substrate is less than or equal to $1 \times 10^{18}$ atoms/cm$^3$.

In accordance with the above-described embodiment of the present invention, in the region of the insulating film which is present in a range of 3 nm or less from the top surface of the insulating film, the concentration of the metal element contained in the glass substrate is less than or equal to $1 \times 10^{18}$ atoms/cm$^3$. Thus, the metal element contained in the glass substrate can be inhibited from being diffused into the oxide semiconductor film.

One embodiment of the present invention is a semiconductor device including a glass substrate, a base insulating film formed using metal oxide over the glass substrate, a gate electrode formed over the base insulating film, a gate insulating film formed over the gate electrode, an oxide semiconductor film which is formed over the gate insulating film and provided in a position overlapping with the gate electrode, and a source electrode and a drain electrode which are electrically connected to the oxide semiconductor film. In addition, in a region of the base insulating film which is present in a range of 3 nm or less from a top surface of the base insulating film, the concentration of a metal element contained in the glass substrate is less than or equal to $1 \times 10^{18}$ atoms/cm$^3$.

One embodiment of the present invention is a semiconductor device including a glass substrate, a gate electrode formed over the glass substrate, a first gate insulating film formed using metal oxide over the gate electrode, a second gate insulating film which has a different composition from the first gate insulating film and is formed over the first gate insulating film, an oxide semiconductor film which is formed over the second gate insulating film and provided in a position overlapping with the gate electrode, and a source electrode and a drain electrode which are electrically connected to the oxide semiconductor film. In addition, in a region of the first gate insulating film which is present in a range of 3 nm or less from a top surface of the first gate insulating film, the concentration of a metal element contained in the glass substrate is less than or equal to $1 \times 10^{18}$ atoms/cm$^3$.

In one embodiment of the present invention, it is preferable that the oxide semiconductor film include a channel region and that, over the oxide semiconductor film, an oxide insulating film located over the channel region be formed.

Further, in one embodiment of the present invention, it is preferable that the metal oxide be aluminum oxide and that the density of the aluminum oxide film be 3.2 g/cm$^3$ or more.

Further, in one embodiment of the present invention, it is preferable that the amount of water released from the aluminum oxide film be less than or equal to $1.0 \times 10^{15}$ atoms/cm$^3$.

Further, in one embodiment of the present invention, it is preferable that the amount of hydrogen released from the aluminum oxide film be less than or equal to $1.0 \times 10^{15}$ atoms/cm$^3$.

Further, in one embodiment of the present invention, it is preferable that the oxide semiconductor film be a film containing at least one oxide selected from the group consisting of indium oxide, zinc oxide, gallium oxide, and tin oxide.

Further, in one embodiment of the present invention, it is preferable that the oxide semiconductor film include a crystal portion where a c-axis is aligned in a direction parallel to a normal vector of a surface where the oxide semiconductor film is formed.

By application of one embodiment of the present invention, the metal element contained in the glass substrate can be inhibited from being diffused into the gate insulating film or the oxide semiconductor film. Further, by application of one embodiment of the present invention, an impurity such as water, hydrogen, or alkali metal which is contained in the glass substrate can be inhibited from being diffused into the gate insulating film or the oxide semiconductor film.

DETAILED DESCRIPTION OF THE INVENTION

Embodiments of the present invention will be described in detail below with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

Embodiment 1

Channel-Stop Contact (CSC) Type Structure

Figure 1A:
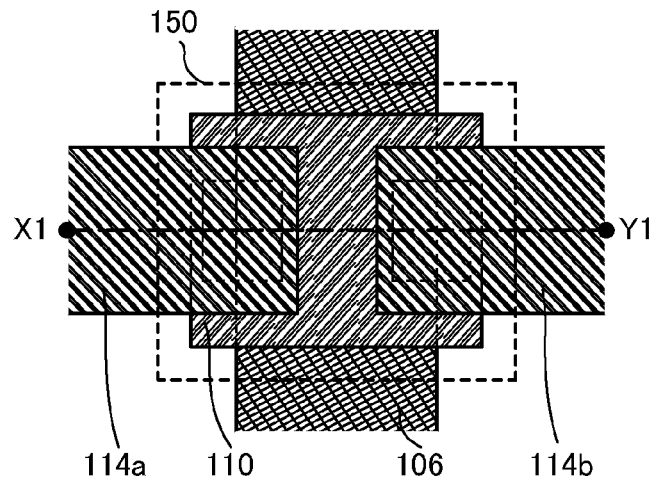
FIG. 1A is a plan view showing a semiconductor device according to one embodiment of the present invention.
Figure 1B:
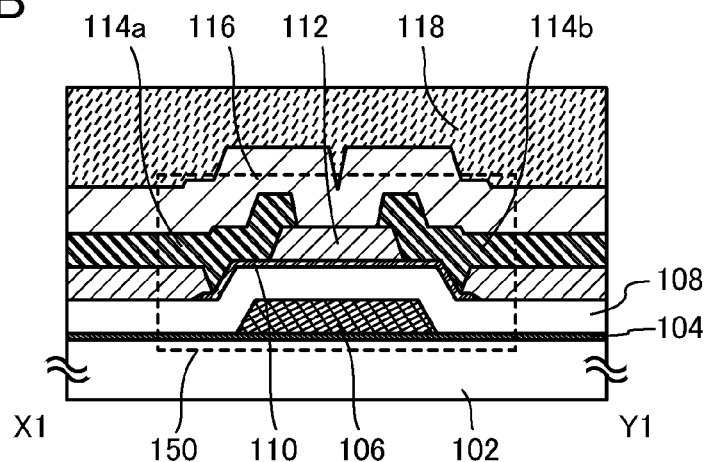
FIG. 1B is a cross-sectional view taken along line X1-Y1 shown in FIG. 1A.

FIG. 1A is a plan view showing a semiconductor device according to one embodiment of the present invention, and FIG. 1B is a cross-sectional view taken along line X1-Y1 shown in FIG. 1A. The semiconductor device includes a transistor 150 having a bottom-gate structure (also referred to as an inverted staggered structure). Note that in FIG. 1A, some components of the transistor 150 (e.g., a gate insulating film 108 or the like) are not illustrated for simplification.

As shown in FIG. 1B, a base insulating film 104 is formed over a substrate 102; the base insulating film 104 is formed using metal oxide. In a region of the base insulating film 104 which is present in the range of 3 nm or less from a surface of the base insulating film 104, the concentration of a metal element contained in the substrate 102 is preferably less than or equal to $1 \times 10^{18}$ atoms/cm$^3$.

A gate electrode 106 is formed over the base insulating film 104. The gate insulating film 108 is formed over the base insulating film 104 and the gate electrode 106. An island-like oxide semiconductor film 110 having a channel region is formed over the gate insulating film 108. The oxide semiconductor film 110 is provided in a position that is in contact with the gate insulating film 108 and overlaps with the gate electrode 106. A protective insulating film 112 is provided over the oxide semiconductor film 110 and the gate insulating film 108. The protective insulating film 112 is located at least over a region of the oxide semiconductor film 110 corresponding to the channel region. A source electrode 114a and a drain electrode 114b are formed over the protective insulating film 112 and the oxide semiconductor film 110. The source electrode 114a and the drain electrode 114b are electrically connected to the oxide semiconductor film 110. In this manner, the transistor 150 having a bottom-gate structure is formed over the substrate 102.

Further, an interlayer insulating film 116 and a planarization insulating film 118 may be provided over the transistor 150. In detail, the interlayer insulating film 116 is provided over the protective insulating film 112, the source electrode 114a, and the drain electrode 114b, and the planarization insulating film 118 is provided over the interlayer insulating film 116.

In accordance with this embodiment, the base insulating film 104 is formed using metal oxide between the substrate 102 and a stack of the gate insulating film 108 and the oxide semiconductor film 110. Therefore, an impurity (water, hydrogen, alkali metal, or the like) contained in the substrate 102 can be inhibited from being diffused into the gate insulating film 108 or the oxide semiconductor film 110. Thus, a highly reliable semiconductor device can be provided.

Figure 1C:
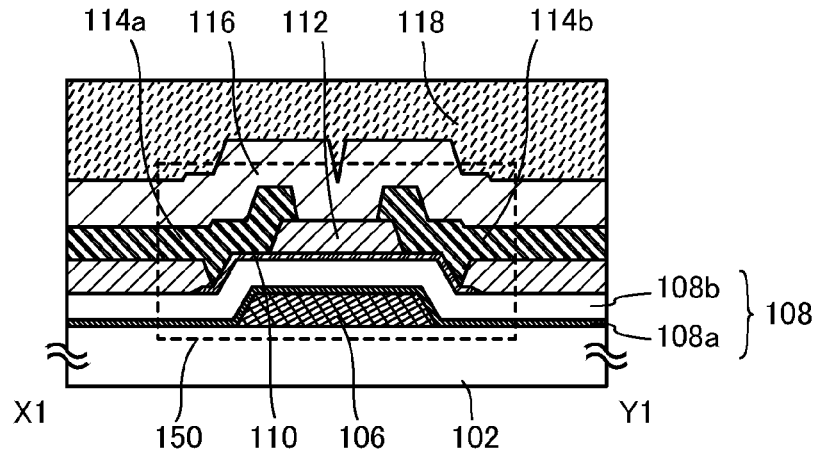
FIG. 1C is a cross-sectional view showing a semiconductor device according to one embodiment of the present invention.

FIG. 1C is a cross-sectional view showing a modification example of the semiconductor device shown in FIG. 1B. The same portions as those in FIG. 1B are denoted by the same reference numerals, and only portions that are different from those in FIG. 1B are described. Note that FIG. 1C corresponds to a cross section taken along line X1-Y1 shown in FIG. 1A.

As shown in FIG. 1C, the gate electrode 106 is formed over the substrate 102, and a first gate insulating film 108a is formed over the gate electrode 106 and the substrate 102; the first gate insulating film 108a is formed using metal oxide. In a region of the first gate insulating film 108a which is present in the range of 3 nm or less from a surface of the first gate insulating film 108a, the concentration of a metal element contained in the substrate 102 is preferably less than or equal to $1 \times 10^{18}$ atoms/cm$^3$.

A second gate insulating film 108b having a different composition from the first gate insulating film 108a is formed over the first gate insulating film 108a. The first gate insulating film 108a and the second gate insulating film 108b form a gate insulating film 108. The island-like oxide semiconductor film 110 is formed over the gate insulating film 108.

Advantageous effects similar to those of this embodiment can also be obtained in this modification example.

Further, in this modification example, the first gate insulating film 108a is formed using metal oxide between a stack of the second gate insulating film 108b and the oxide semiconductor film 110 and a stack of the substrate 102 and the gate electrode 106. Therefore, metal (e.g., Cu) contained in the gate electrode 106 can be inhibited from being diffused into the second gate insulating film 108b or the oxide semiconductor film 110. Thus, a highly reliable semiconductor device can be provided.

[Detailed Description of Oxide Semiconductor Film 110]

The oxide semiconductor film 110 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase.

Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification and the like, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film).

Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

The change in electrical characteristics of the transistor including the CAAC-OS film, due to irradiation with visible light or ultraviolet light, is small. Further, the change in the threshold value of the transistor including the CAAC-OS film is small, and the variation in the threshold value of the transistors including the CAAC-OS film is small. Thus, the transistor has high reliability.

In a crystal part or a crystalline oxide semiconductor film, defects in the bulk can be further reduced. Further, when the surface flatness of the crystal part or the crystalline oxide semiconductor film is enhanced, a transistor including the oxide semiconductor film can have higher field-effect mobility than a transistor including an amorphous oxide semiconductor film. In order to improve the surface flatness of the oxide semiconductor film, the oxide semiconductor film is preferably formed over a flat surface. Specifically, the oxide semiconductor may be formed over a surface with the average surface roughness ($R_a$) of less than or equal to 0.15 nm, preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a designated surface" and is defined by the formula below.

$$Ra = \frac{1}{S_0} \int_{y_1}^{y_2} \int_{x_1}^{x_2} |f(x, y) - Z_0| \, dx \, dy \quad \text{[FORMULA 1]}$$

In Formula 1, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be evaluated using an atomic force microscope (AFM).

For the oxide semiconductor film, an oxide semiconductor having a wider band gap than that of silicon, i.e., 1.1 eV, is preferably used. For example, an In—Ga—Zn-based oxide semiconductor having a band gap of 3.15 eV, indium oxide having a band gap of about 3.0 eV, indium tin oxide having a band gap of about 3.0 eV, indium gallium oxide having a band gap of about 3.3 eV, indium zinc oxide having a band gap of about 2.7 eV, tin oxide having a band gap of about 3.3 eV, zinc oxide having a band gap of about 3.37 eV, or the like can be preferably used. With the use of such a material, the off-state current of the transistor can be kept extremely low.

An oxide semiconductor used for the oxide semiconductor film preferably contains at least one selected from the group consisting of indium (In), zinc (Zn), and gallium (Ga). In particular, In and Zn are preferably contained. As a stabilizer for reducing a variation in electrical characteristics among transistors including the oxide semiconductor, tin (Sn) is preferably contained.

For example, as the oxide semiconductor, any of the following can be used: indium oxide; tin oxide; zinc oxide; a two-component metal oxide such as an In—Zn-based oxide, a Sn—Zn-based oxide, or In—Ga-based oxide; a three-component metal oxide such as an In—Ga—Zn-based oxide (also referred to as IGZO), In—Sn—Zn-based oxide, Sn—Ga—Zn-based oxide; and a four-component metal oxide such as an In—Sn—Ga—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0, m is not an integer) may be used as an oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0, n is an integer) may be used.

For example, In—Ga—Zn-based oxide with an atomic ratio where In:Ga:Zn=1:1:1, In:Ga:Zn=3:1:2, or In:Ga:Zn=2:1:3, or an oxide whose composition is in the neighborhood of the above compositions can be used.

In a formation step of the oxide semiconductor film, it is preferable that hydrogen or water be contained in the oxide semiconductor film as little as possible. For example, it is preferable that the substrate be preheated in a preheating chamber of a sputtering apparatus as pretreatment for formation of the oxide semiconductor film so that an impurity such as hydrogen or moisture adsorbed to the substrate are eliminated and removed. Then, the oxide semiconductor film is preferably formed in a film formation chamber from which remaining moisture is removed.

In order to remove the moisture in the preheating chamber and the film formation chamber, an entrapment vacuum pump, for example, a cryopump, an ion pump, or a titanium sublimation pump is preferably used. Further, an evacuation unit may be a turbo pump provided with a cold trap. From the preheating chamber and the film formation chamber which is evacuated with a cryopump, a hydrogen atom, a compound containing a hydrogen atom such as water ($H_2O$) (preferably, also a compound containing a carbon atom), and the like are removed, whereby the concentration of an impurity such as hydrogen or moisture in the oxide semiconductor film can be reduced.

Note that an In—Ga—Zn-based oxide film is formed as the oxide semiconductor film by a sputtering method. The oxide semiconductor film can be formed by a sputtering method in a rare gas (typically argon) atmosphere, an oxygen atmosphere, or a mixed atmosphere of a rare gas and oxygen.

As a target used for forming an In—Ga—Zn-based oxide film as the oxide semiconductor film by a sputtering method, for example, a metal oxide target with an atomic ratio where In:Ga:Zn=1:1:1, a metal oxide target with an atomic ratio where In:Ga:Zn=3:1:2, or a metal oxide target with an atomic ratio where In:Ga:Zn=2:1:3 can be used. However, a material and composition of a target used for formation of the oxide semiconductor film is not limited to the above.

Further, when the oxide semiconductor film is formed using the above metal oxide target, the composition of the target is different from the composition of a film formed over the substrate in some cases. For example, when the metal oxide target having a molar ratio of $In_2O_3:Ga_2O_3:ZnO=1:1:1$ is used, the composition ratio of the thin oxide semiconductor film becomes $In_2O_3:Ga_2O_3:ZnO=1:1:0.6$ to 1:1:0.8 [molar ratio] in some cases, though it depends on the film formation conditions. This is because in formation of the oxide semiconductor film, ZnO is sublimed, or because a sputtering rate differs between the components of $In_2O_3$, $Ga_2O_3$, and ZnO.

Accordingly, when a thin film having a preferable composition ratio is formed, a composition ratio of the metal oxide target needs to be adjusted in advance. For example, in order to make the composition ratio of the thin oxide semiconductor film be $In_2O_3:Ga_2O_3:ZnO=1:1:1$ [molar ratio], the composition ratio of the metal oxide target is made to be $In_2O_3:Ga_2O_3:ZnO=1:1:1.5$ [molar ratio]. In other words, the ZnO content of the metal oxide target is made higher in advance. The composition ratio of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The relative density of the metal oxide target is 90% to 100% inclusive, preferably, 95% to 99.9% inclusive. By using the metal oxide target with high relative density, a dense oxide semiconductor film can be formed.

As a sputtering gas used for forming the oxide semiconductor film, it is preferable to use a high-purity gas from which impurities such as hydrogen, water, hydroxyl groups, or hydrides are removed.

There are three methods for forming a CAAC-OS film when the CAAC-OS film is used as the oxide semiconductor film. The first method is to form an oxide semiconductor film at a temperature higher than or equal to 200° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film. The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film. The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

By heating the substrate during film formation, the concentration of an impurity such as hydrogen or water in the oxide semiconductor film formed can be reduced. In addition, damage by sputtering can be reduced, which is preferable. The oxide semiconductor film may be formed by an ALD (atomic layer deposition) method, an evaporation method, a coating method, or the like.

Note that when a crystalline (single-crystal or microcrystalline) oxide semiconductor film other than a CAAC-OS film is formed as the oxide semiconductor film, the film formation temperature and the temperature of heat treatment are not particularly limited.

As a method for processing the oxide semiconductor film, a wet etching method or a dry etching method can be used to etch the oxide semiconductor film. An etching gas such as $BCl_3$, $Cl_2$, or $O_2$ can be used in the dry etching method. Further, a dry etching apparatus using a high-density plasma source such as electron cyclotron resonance (ECR) or inductive coupled plasma (ICP) can be used to improve a dry etching rate.

After the oxide semiconductor film is formed, the oxide semiconductor film may be subjected to heat treatment. The temperature of the heat treatment is higher than or equal to 300° C. and lower than or equal to 700° C., or lower than the strain point of the substrate. Through the heat treatment, excess hydrogen (including water and a hydroxyl group) contained in the oxide semiconductor film can be removed. Note that the heat treatment is also referred to as dehydration treatment (dehydrogenation treatment) in this specification and the like in some cases.

The heat treatment can be performed in such a manner that, for example, an object to be processed is introduced into an electric furnace in which a resistance heater or the like is used and heated at 450° C. in a nitrogen atmosphere for an hour. The oxide semiconductor film is not exposed to the air during the heat treatment so that entry of water or hydrogen can be prevented.

Note that a heat treatment apparatus is not limited to an electric furnace, and may include a device for heating an object to be processed by heat conduction or heat radiation from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The dehydration treatment (dehydrogenation treatment) might be accompanied by elimination of oxygen which is a main constituent material for an oxide semiconductor film to lead to a reduction in oxygen. An oxygen vacancy exists in a portion where oxygen is eliminated in an oxide semiconductor film, and a donor level which leads to a change in the electrical characteristics of a transistor is formed owing to the oxygen vacancy. Therefore, in the case where the dehydration treatment (dehydrogenation treatment) is performed, oxygen is preferably supplied to the oxide semiconductor film. By supply of oxygen to the oxide semiconductor film, an oxygen vacancy in the film can be repaired.

The oxygen vacancy in the oxide semiconductor film may be repaired in the following manner for example: after the oxide semiconductor film is subjected to the dehydration treatment (dehydrogenation treatment), a high-purity oxygen gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) is introduced into the same furnace. It is preferable that water, hydrogen, and the like not be contained in the oxygen gas or the nitrous oxide gas. The purity of the oxygen gas or the nitrous oxide gas which is introduced into the heat treatment apparatus is preferably 6N (99.9999%) or more, further preferably 7N (99.99999%) or more (i.e., the impurity concentration in the oxygen gas or the nitrous oxide gas is preferably less than or equal to 1 ppm, further preferably less than or equal to 0.1 ppm).

As an example of a method of supplying oxygen to the oxide semiconductor film, oxygen (including at least any one of oxygen radicals, oxygen atoms, and oxygen ions) is added to the oxide semiconductor film in order to supply oxygen to the oxide semiconductor film. An ion implantation method, an ion doping method, a plasma immersion ion implantation method, plasma treatment, or the like can be used as a method for adding oxygen.

As another example of a method for supplying oxygen to the oxide semiconductor film, oxygen may be supplied to the oxide semiconductor film in such a manner that the base insulating film, the gate insulating film to be formed later, or the like is heated and part of oxygen is released.

As described above, after formation of the oxide semiconductor film, it is preferable that dehydration treatment (dehydrogenation treatment) be performed to remove hydrogen or moisture from the oxide semiconductor film, so that the oxide semiconductor film is highly purified so as to include as few impurities as possible, and oxygen whose amount is reduced in the dehydration treatment (dehydrogenation treatment) be added to the oxide semiconductor or oxygen be supplied excessively to fill the oxygen vacancies in the oxide semiconductor film. Further, supplying oxygen to the oxide semiconductor film may be expressed as oxygen adding treatment or oxygen supplying treatment.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film. Specifically, the concentration of hydrogen in the oxide semiconductor film, which is measured by SIMS, is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$. Note that the concentration of hydrogen in the oxide semiconductor film is measured by secondary ion mass spectrometry (SIMS).

The number of carriers generated due to a donor in the oxide semiconductor film, in which hydrogen concentration is reduced to a sufficiently low concentration so that the oxide semiconductor film is purified and in which defect states in an energy gap due to oxygen deficiency are reduced by sufficiently supplying oxygen as described above, is very small (close to zero); carrier concentration is less than $1\times10^{12}$/cm$^3$, preferably less than $1\times10^{11}$/cm$^3$, more preferably less than $1.45\times10^{10}$/cm$^3$. In a transistor including such an oxide semiconductor film, the off-state current (per unit channel width (1 μm) here) at room temperature (25° C.), for example, is less than or equal to 100 zA (1 zA (zeptoampere) is $1\times10^{-21}$ A), preferably less than or equal to 10 zA, more preferably less than or equal to 100 yA (1 yA (yoctoampere) is $1\times10^{-24}$ A). The transistor with very excellent off-state current characteristics can be obtained with the use of such an i-type (intrinsic) or substantially i-type oxide semiconductor.

Embodiment 1

Method for Manufacturing Channel-Stop Contact (CSC) Type Structure

A method for manufacturing the semiconductor device shown in FIG. 1B is described with reference to FIGS. 2A to 2D and FIGS. 3A to 3C. Note that portions similar to those in FIG. 1B are denoted by the same reference numerals, and description thereof is omitted.

Figure 2A:
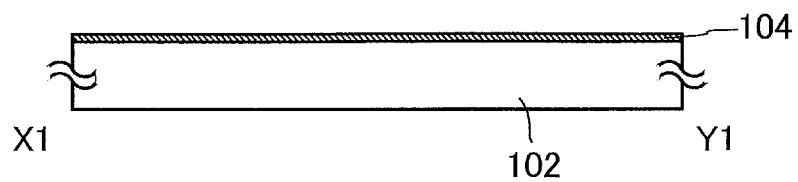
FIGS. 2A to 2D are cross-sectional views illustrating a method for manufacturing the semiconductor device shown in FIG. 1B.

First, the base insulating film 104 is formed using metal oxide over the substrate 102 (see FIG. 2A).

For the substrate 102, a glass material such as aluminosilicate glass, aluminoborosilicate glass, or barium borosilicate glass is used. In the mass production, a mother glass with the following size is preferably used for the substrate 102: the 8-th generation (2160 mm×2460 mm); the 9-th generation (2400 mm×2800 mm, or 2450 mm×3050 mm); the 10-th generation (2950 mm×3400 mm); or the like. High process temperature and a long period of process time drastically shrink the mother glass. Thus, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

As the base insulating film 104, an aluminum oxide film can be used, for example. The aluminum oxide film is formed by a sputtering method and preferably has a film density of 3.2 g/cm$^3$ or more, further preferably, 3.6 g/cm$^3$ or more. With the use of the above-described aluminum oxide film as the gate insulating film 104, an impurity can be prevented from being diffused from the substrate 102 into the transistor 150. The impurity from the substrate 102 is, for example, hydrogen, a metal element, or the like. As the metal element, elements such as sodium, aluminum, magnesium, calcium, strontium, barium, silicon, and boron are given. The base insulating film 104 can be formed to a thickness of greater than or equal to 5 nm and less than or equal to 150 nm (preferably greater than or equal to 10 nm and less than or equal to 100 nm).

In a region of the base insulating film 104 which is present in the range of 3 nm or less from a surface of the base insulating film 104, the concentration of the metal element contained in the glass substrate is preferably less than or equal to $1\times10^{18}$ atoms/cm$^3$.

The base insulating film 104 is preferably a film which releases a smaller amount of water ($H_2O$) or hydrogen ($H_2$). For example, an aluminum oxide film can be used as the base insulating film 104. It is preferable that the amount of water ($H_2O$) released from the aluminum oxide film be less than or equal to $5\times10^{15}$ atoms/cm$^3$, more preferably less than or equal to $1\times10^{15}$ atoms/cm$^3$. Further, it is preferable that the amount of hydrogen ($H_2$) released from the aluminum oxide film be less than or equal to $5\times10^{15}$ atoms/cm$^3$, more preferably less than or equal to $1\times10^{15}$ atoms/cm$^3$.

For example, in the case where a film which releases a large amount of hydrogen or water is used as the base insulating film 104, there is a possibility that water or hydrogen be released from the base insulating film 104 in a process of forming the transistor 150 and diffused into the oxide semiconductor film 110 in the transistor 150. Therefore, with the use of the base insulating film 104 which releases the above-described amount of hydrogen or water, an impurity diffused into the transistor 150 can be reduced, which leads to a highly reliable semiconductor device.

Note that the amount of released water and the amount of released hydrogen can be measured by thermal desorption spectroscopy (TDS).

Figure 2B:
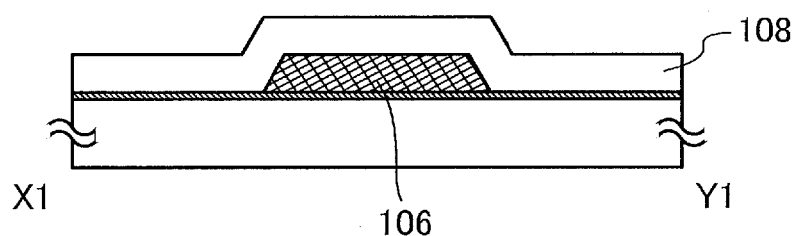

Next, after a conductive film is formed over the base insulating film 104, the gate electrode 106 is formed by a photolithography step and an etching step, and then, the gate insulating film 108 is formed over the base insulating film 104 and the gate electrode 106 (see FIG. 2B).

The gate electrode 106 can be formed by a sputtering method or the like to have a single-layer structure or a stacked-layer structure using a metal material such as molybdenum, titanium, tantalum, tungsten, aluminum, copper, neodymium, or scandium, or an alloy material containing at least any one of these materials.

The gate insulating film 108 can be formed by, for example, a PE-CVD method, using silicon oxide, gallium oxide, aluminum oxide, silicon nitride, silicon oxynitride, aluminum oxynitride, silicon nitride oxide, or the like. The thickness of the gate insulating film 108 can be, for example, greater than or equal to 10 nm and less than or equal to 500 nm, preferably greater than or equal to 50 nm and less than or equal to 300 nm.

It is preferable that the gate insulating film 108 contain oxygen in a portion which is in contact with the oxide semiconductor film 110 to be formed later. In particular, the gate insulating film 108 preferably contains oxygen at an amount which exceeds at least the stoichiometric composition. For example, in the case where silicon oxide is used for the gate insulating film 108, the composition formula is preferably $SiO_{2+\alpha}$ ($\alpha>0$). In this embodiment, silicon oxide of $SiO_{2+\alpha}$ ($\alpha>0$) is used for the gate insulating film 108. With the use of the silicon oxide for the gate insulating film 108, oxygen can be supplied to the oxide semiconductor film 110 to be formed later and the oxide semiconductor film 110 can have excellent electrical characteristics.

The gate insulating film 108 can be formed using a high-k material such as hafnium oxide, yttrium oxide, hafnium silicate ($HfSiO_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide. By using such a material, gate leakage current can be reduced. Further, the gate insulating film 108 may have a single-layer structure or a stacked-layer structure.

Next, heat treatment may be performed on the substrate 102 provided with the gate insulating film 108.

The heat treatment can be performed using, for example, an apparatus for heating an object by heat conduction or heat radiation from a heating element such as an electric furnace or a resistance heating element. An electric furnace or a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. Alternatively, oxygen may be used as another high-temperature gas. When oxygen is used, release of oxygen from the gate insulating film 108 can be inhibited or supply of oxygen to the gate insulating film 108 can be performed.

In the case where the mother glass is used as the substrate 102, high process temperature and a long period of process time drastically shrink the mother glass; therefore, the process temperature of the heat treatment is preferably higher than or equal to 200° C. and lower than or equal to 450° C., more preferably higher than or equal to 250° C. and lower than or equal to 350° C.

An impurity such as water or hydrogen in the gate insulating film 108 can be removed by the heat treatment. Further, by the heat treatment, the defect density in the gate insulating film 108 can be reduced. The reduction of the impurity in the gate insulating film 108 or the defect density in the film leads to improvement in reliability of the semiconductor device. For example, degradation of the semiconductor device during a negative bias stress test with light irradiation, which is one of the reliability tests for semiconductor devices, can be suppressed.

The heat treatment may be performed as pretreatment for formation of the oxide semiconductor film 110 to be formed later. For example, after the gate insulating film 108 is formed, heat treatment is performed in a vacuum in a preheating chamber of a sputtering apparatus and the oxide semiconductor film 110 is then formed.

Furthermore, the heat treatment may be performed more than once. For example, after the gate insulating film 108 is formed, heat treatment is performed in a nitrogen atmosphere with an electric furnace or the like; then, after heat treatment is performed in a vacuum in a preheating chamber of a sputtering apparatus, the oxide semiconductor film 110 is then formed.

Figure 2C:
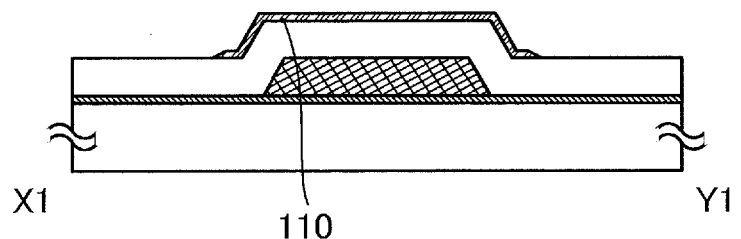

Next, an oxide semiconductor film is formed over the gate insulating film 108, and a photolithography step and an etching step are performed; thus, the island-like semiconductor film 110 is formed (see FIG. 2C).

Detailed description of the oxide semiconductor film 110, a method for manufacturing the oxide semiconductor film 110, and the like is omitted here since it is already mentioned in [Detailed Description of Oxide Semiconductor Film 110].

Figure 2D:
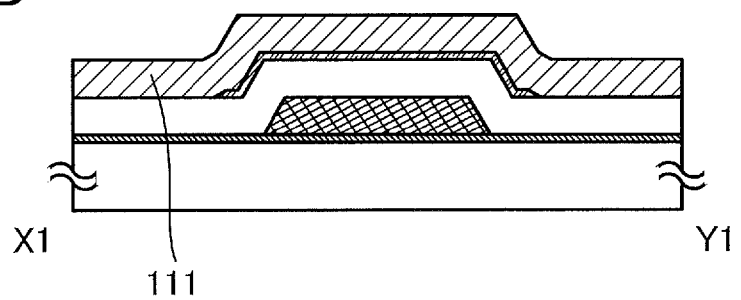

Next, an insulating film 111 is formed over the gate insulating film 108 and the oxide semiconductor film 110 (see FIG. 2D).

The insulating film 111 can be formed by, for example, a PE-CVD method, using any of the following inorganic materials: silicon oxide, silicon oxynitride, silicon nitride oxide, silicon nitride, gallium oxide, zinc oxide, hafnium oxide, aluminum oxide, and the like. Note that a plurality of insulating films each formed using any of these materials may be stacked. In this embodiment, silicon oxide is used.

Specifically, silicon oxide or the like containing more oxygen than the stoichiometric composition is preferably used as the insulating film 111. Silicon oxide containing more oxygen than the stoichiometric composition can provide oxygen to the oxide semiconductor film 110, so that generation of oxygen vacancies in the oxide semiconductor film 110 can be prevented. The thickness of the insulating film 111 can be greater than or equal to 50 nm and less than or equal to 600 nm (preferably greater than or equal to 100 nm and less than or equal to 400 nm).

Figure 3A:
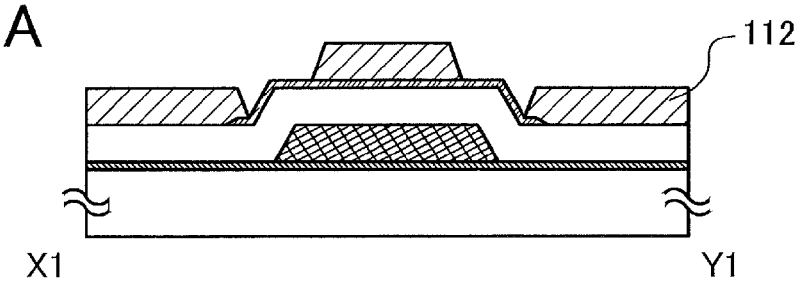
FIGS. 3A to 3C are cross-sectional views illustrating the method for manufacturing the semiconductor device shown in FIG. 1B.
Figure 3B:
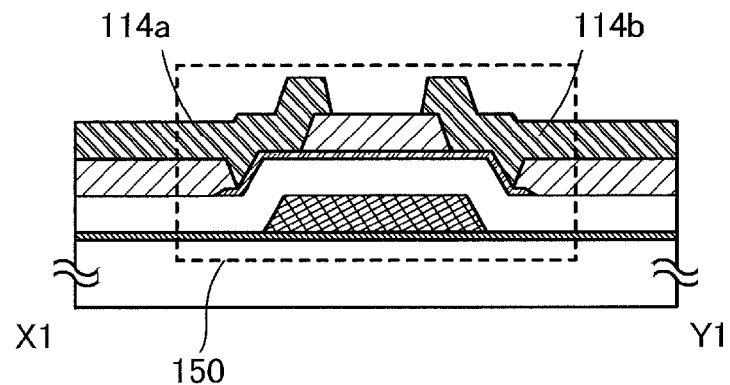

Next, after the insulating film 111 is formed, the insulating film 111 is processed by a photolithography step and an etching step to form an opening reaching the oxide semiconductor film 110; thus, the protective insulating film 112 is formed (see FIG. 3A).

In this embodiment, the protective insulating film 112 is formed to cover the channel region of the oxide semiconductor film 110 and a side surface of the island-like oxide semiconductor film 110. Such a structure can inhibit process damage to the channel region of the oxide semiconductor film 110 and the side surface of the oxide semiconductor film 110 in processing the source electrode 114a and the drain electrode 114b to be formed later, or mixture or adhesion of an impurity in an etchant or an etching gas used in the processing.

Next, a conductive film is formed over the protective insulating film 112 and the oxide semiconductor film 110, and the conductive film is subjected to a photolithography step and an etching step; thus, the source electrode 114a and the drain electrode 114b which are electrically connected to the oxide semiconductor film 110 are formed. At this stage, the transistor 150 is formed (see FIG. 3B).

As the conductive film used for the source electrode 114a and the drain electrode 114b, a metal film containing an element selected from Al, Cr, Cu, Ta, Ti, Mo, and W, a metal nitride film containing any of the above elements as a component (a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like.

Figure 3C:
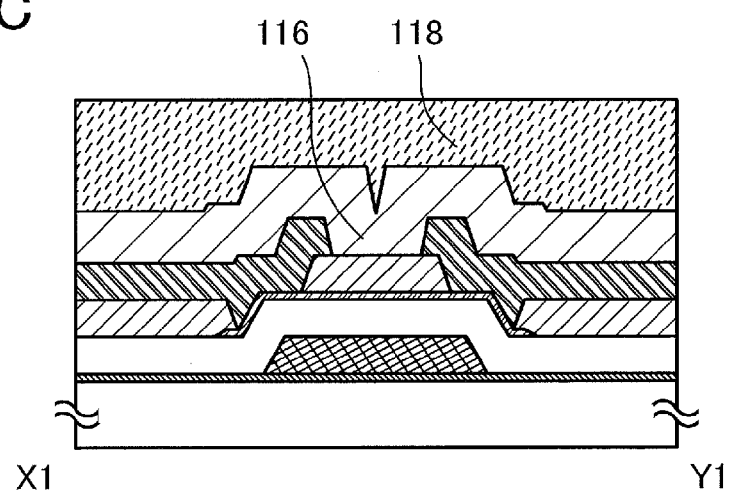

Next, the interlayer insulating film 116 and the planarization insulating film 118 are formed over the transistor 150 (see FIG. 3C).

The interlayer insulating film 116 can be formed using a material and a method which are the same or substantially the same those of the gate insulating film 108.

As the planarization insulating film 118, for example, an organic resin material such as a polyimide-based resin, an acrylic-based resin, or a benzocyclobutene-based resin can be used. With the planarization insulating film 118, the surface of the transistor 150 can be flat.

Further, a conductive film (not shown) may be formed over the planarization insulating film 118. For the conductive film, a conductive material with a light-transmitting property, for example, indium tin oxide (ITO), indium tin oxide containing silicon or silicon oxide, indium zinc oxide, graphene, or the like can be used. Note that the material of the conductive film is not limited to the above. For example, a metal film (a film of aluminum, titanium, or the like) may be used. Such a metal film is preferably used because the transistor 150 can be shielded from light.

The conductive film also has a function of shielding the transistor 150 from static charges (what is called an electrostatic discharge: ESD). With the conductive film over the transistor 150, charge due to electrostatic discharge (ESD) or the like can be dissipated.

Through the above manufacturing steps, the semiconductor device shown in FIG. 1B can be manufactured.

A method for manufacturing the semiconductor device shown in FIG. 1C is the same or substantially the same as the above-described method for manufacturing the semiconductor device shown in FIG. 1B, except the following.

After a conductive film is formed over the substrate 102, the gate electrode 106 is formed by a photolithography step and an etching step. Next, the first gate insulating film 108a is formed using metal oxide over the gate electrode 106 and the substrate 102. Then, the second gate insulating film 108b is formed over the first gate insulating film 108a. Note that the first gate insulating film 108a may be formed using a film and a method which are the same or substantially the same as those of the base insulating film 104 shown in FIG. 1B. The second gate insulating film 108b may be formed using a film and a method which are the same or substantially the same as those of the gate insulating film 108 shown in FIG. 1B.

Embodiment 2

Channel-Stop Island (CSI) Type Structure

Figure 4A:
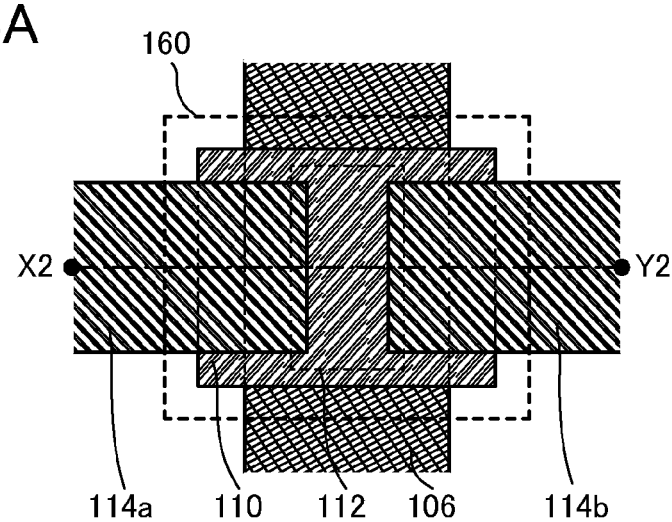
FIG. 4A is a plan view showing a semiconductor device according to one embodiment of the present invention.
Figure 4B:
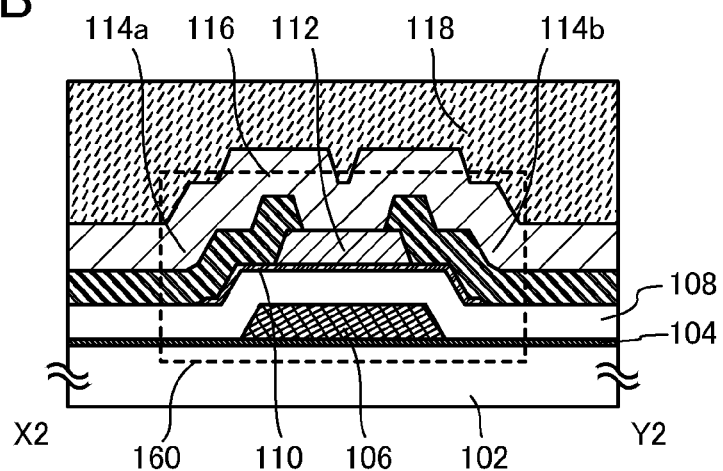
FIG. 4B is a cross-sectional view taken along line X2-Y2 shown in FIG. 4A.

FIG. 4A is a plan view showing a semiconductor device according to one embodiment of the present invention. FIG. 4B is a cross-sectional view taken along line X2-Y2 shown in FIG. 4A. The semiconductor device includes a transistor 160 having a bottom-gate structure. Note that in FIG. 4A, some components of the transistor 160 (e.g., a gate insulating film 108 or the like) are not illustrated for simplification.

As shown in FIG. 4B, a base insulating film 104 is formed over the substrate 102; the base insulating film 104 is formed using metal oxide. In a region of the base insulating film 104 which is present in the range of 3 nm or less from a surface of the base insulating film 104, the concentration of a metal element contained in the substrate 102 is preferably less than or equal to $1\times10^{18}$ atoms/cm$^3$.

A gate electrode 106 is formed over the base insulating film 104. A gate insulating film 108 is formed over the base insulating film 104 and the gate electrode 106. An island-like oxide semiconductor film 110 having a channel region is formed over the gate insulating film 108. The oxide semiconductor film 110 is provided in a position that is in contact with the gate insulating film 108 and overlaps with the gate electrode 106. A protective insulating film 112 is provided over the oxide semiconductor film 110. The protective insulating film 112 is located at least over a region of the oxide semiconductor film 110 corresponding to the channel region. A source electrode 114a and a drain electrode 114b are formed over the protective insulating film 112, the oxide semiconductor film 110, and the gate insulating film 108. The source electrode 114a and the drain electrode 114b are electrically connected to the oxide semiconductor film 110. In this manner, the transistor 160 having a bottom-gate structure is formed over the substrate 102.

Further, the interlayer insulating film 116 and the planarization insulating film 118 may be provided over the transistor 160. In detail, the interlayer insulating film 116 is provided over the protective insulating film 112, the source electrode 114a, and the drain electrode 114b, and the planarization insulating film 118 is provided over the interlayer insulating film 116.

Note that the protective insulating film 112 does not cover the side surface of the oxide semiconductor film 110 in FIG. 4B, while the protective insulating film 112 is formed to cover the side surface of the island-like oxide semiconductor film 110 in FIG. 1B. In this point, the semiconductor device of FIG. 4B is different from the semiconductor device of FIG. 1B.

Advantageous effects similar to those of Embodiment 1 can also be obtained in this embodiment.

Figure 4C:
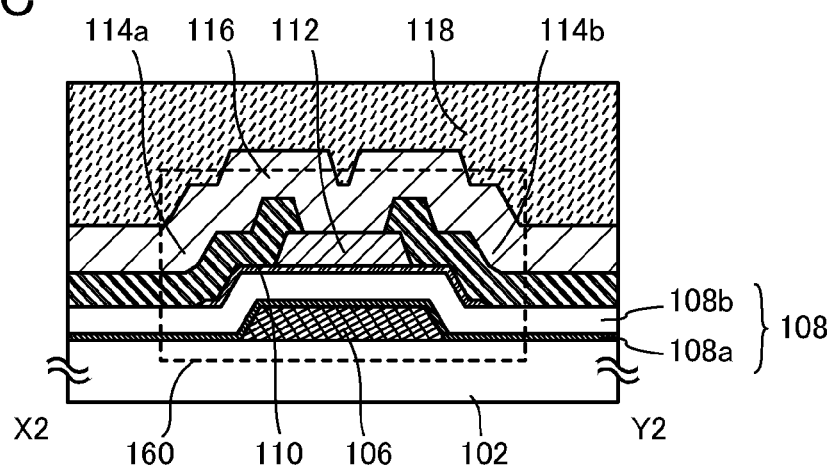
FIG. 4C is a cross-sectional view showing a modification example of the semiconductor device shown in FIG. 4B.

FIG. 4C is a cross-sectional view showing a modification example of the semiconductor device shown in FIG. 4B. The same portions as those in FIG. 4B are denoted by the same reference numerals, and only portions that are different from those in FIG. 4B are described. FIG. 4C corresponds to a cross-sectional view taken along line X2-Y2 shown in FIG. 4A.

As shown in FIG. 4C, the gate electrode 106 is formed over the substrate 102, and the first gate insulating film 108a is formed over the gate electrode 106 and the substrate 102; the first gate insulating film 108a is formed using metal oxide. In a region of the first gate insulating film 108a which is present in the range of 3 nm or less from a surface of the first gate insulating film 108a, the concentration of a metal element contained in the substrate 102 is preferably less than or equal to $1\times10^{18}$ atoms/cm$^3$.

The second gate insulating film 108b having a different composition from the first gate insulating film 108a is formed over the first gate insulating film 108a. The first gate insulating film 108a and the second gate insulating film 108b form the gate insulating film 108. The island-like oxide semiconductor film 110 is formed over the gate insulating film 108.

Advantageous effects similar to those of the modification example of Embodiment 1 can also be obtained in this modification example.

Embodiment 2

Method for Manufacturing Channel-Stop Island (CSI) Type Structure

A method for manufacturing the semiconductor device shown in FIG. 4B is the same or substantially the same as the method for manufacturing the semiconductor device which is shown in FIGS. 2A to 2D and FIGS. 3A to 3C, except the following.

After the insulating film 111 is formed, the insulating film 111 is processed by a photolithography step and an etching step; thus, the protective insulating film 112 located over a region corresponding to the channel region of the oxide semiconductor film 110 is formed over the oxide semiconductor film 110.

In this embodiment, the protective insulating film 112 is formed to cover the channel region of the oxide semiconductor film 110. Such a structure can inhibit process damage to the channel region of the oxide semiconductor film 110 in processing the source electrode 114a and the drain electrode 114b to be formed later, or mixture or adhesion of an impurity in an etching gas or an etchant used in the processing.

Next, the conductive film is formed over the protective insulating film 112, the oxide semiconductor film 110, and the gate insulating film 108, and the conductive film is subjected to a photolithography step and an etching step; thus, the source electrode 114a and the drain electrode 114b which are electrically connected to the oxide semiconductor film 110 are formed. At this stage, the transistor 160 is formed.

A method for manufacturing the semiconductor device shown in FIG. 4C is the same or substantially the same as the method for manufacturing the semiconductor device shown in FIG. 4B, except the following.

After the conductive film is formed over the substrate 102, the gate electrode 106 is formed by a photolithography step and an etching step. Next, the first gate insulating film 108a is formed using metal oxide over the gate electrode 106 and the substrate 102. Then, the second gate insulating film 108b is formed over the first gate insulating film 108a. The first gate insulating film 108a may be formed using a film and a method which are the same or substantially the same as those of the base insulating film 104 shown in FIG. 4B. The second gate insulating film 108b may be formed using a film and a method which are the same or substantially the same as those of the gate insulating film 108 shown in FIG. 4B.

Embodiment 3

Channel-Etched (CE) Type Structure

Figure 5A:
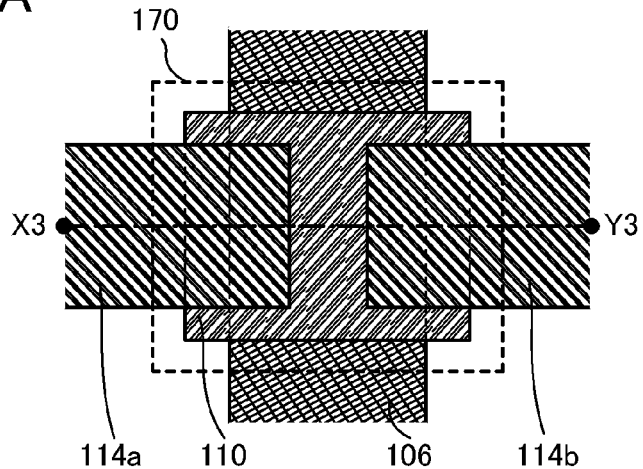
FIG. 5A is a plan view showing a semiconductor device according to one embodiment of the present invention.
Figure 5B:
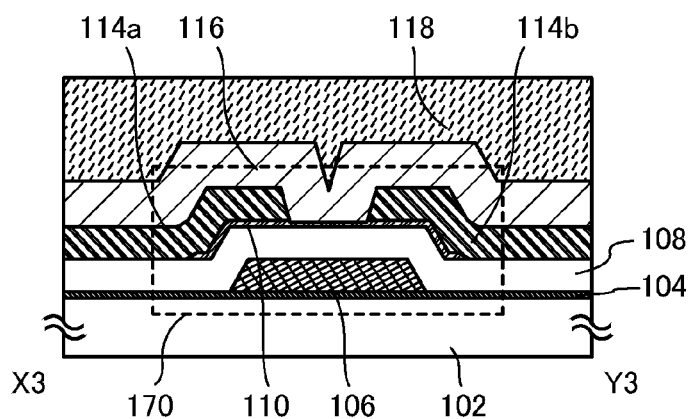
FIG. 5B is a cross-sectional view taken along line X3-Y3 shown in FIG. 5A.

FIG. 5A is a plan view showing a semiconductor device according to one embodiment of the present invention, and FIG. 5B is a cross-sectional view taken along line X3-Y3 shown in FIG. 5A. The semiconductor device includes a transistor 170 having a bottom-gate structure. Note that in FIG. 5A, some components of the transistor 170 (e.g., the gate insulating film 108 or the like) are not illustrated for simplification.

As shown in FIG. 5B, a base insulating film 104 is formed over the substrate 102; the base insulating film 104 is formed using metal oxide. In a region of the base insulating film 104 which is present in the range of 3 nm or less from a surface of the base insulating film 104, the concentration of a metal element contained in the substrate 102 is preferably less than or equal to $1\times10^{18}$ atoms/cm$^3$.

A gate electrode 106 is formed over the base insulating film 104. A gate insulating film 108 is formed over the base insulating film 104 and the gate electrode 106. An island-like oxide semiconductor film 110 having a channel region is formed over the gate insulating film 108. The oxide semiconductor film 110 is provided in a position that is in contact with the gate insulating film 108 and overlaps with the gate electrode 106. A source electrode 114a and a drain electrode 114b are formed over the oxide semiconductor film 110 and the gate insulating film 108. The source electrode 114a and the drain electrode 114b are electrically connected to the oxide semiconductor film 110. In this manner, the transistor 170 having a bottom-gate structure is formed over the substrate 102.

Further, the interlayer insulating film 116 and the planarization insulating film 118 may be provided over the transistor 170. In detail, the interlayer insulating film 116 is provided over the oxide semiconductor film 110, the source electrode 114a, and the drain electrode 114b, and the planarization insulating film 118 is provided over the interlayer insulating film 116.

Note that the semiconductor device shown in FIG. 5B does not include the protective insulating film 112, while the semiconductor device shown in FIG. 1B includes the protective insulating film 112. In this point, the semiconductor device of FIG. 5B is different from the semiconductor device of FIG. 1B.

Advantageous effects similar to those of Embodiment 1 can also be obtained in this embodiment.

Figure 5C:
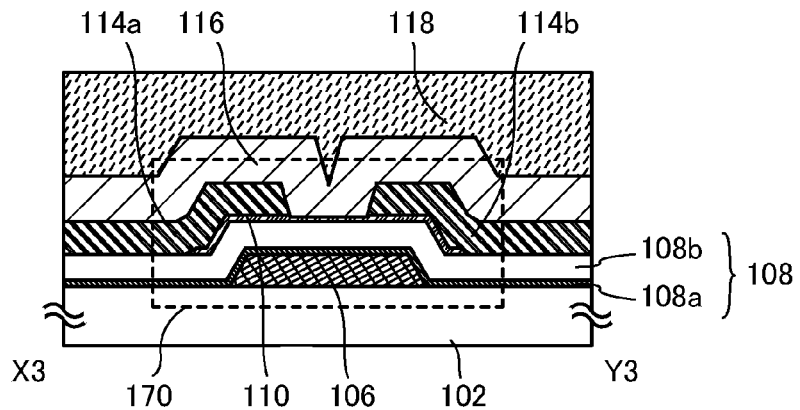
FIG. 5C is a cross-sectional view showing a modification example of the semiconductor device shown in FIG. 5B.

FIG. 5C is a cross-sectional view showing a modification example of the semiconductor device shown in FIG. 5B. The same portions as those in FIG. 5B are denoted by the same reference numerals, and only portions that are different from those in FIG. 5B are described. FIG. 5C corresponds to a cross-sectional view taken along line X3-Y3 shown in FIG. 5A.

As shown in FIG. 5C, the gate electrode 106 is formed over the substrate 102, and the first gate insulating film 108a is formed over the gate electrode 106 and the substrate 102; the first gate insulating film 108a is formed using metal oxide. In a region of the first gate insulating film 108a which is present in the range of 3 nm or less from a surface of the first gate insulating film 108a, the concentration of a metal element contained in the substrate 102 is preferably less than or equal to $1\times10^{18}$ atoms/cm$^3$.

The second gate insulating film 108b having a different composition from the first gate insulating film 108a is formed over the first gate insulating film 108a. The first gate insulating film 108a and the second gate insulating film 108b form the gate insulating film 108. The island-like oxide semiconductor film 110 is formed over the gate insulating film 108.

Advantageous effects similar to those of the modification example of Embodiment 1 can also be obtained in this modification example.

Embodiment 3

Method for Manufacturing Channel-Etched (CE) Type Structure

A method for manufacturing the semiconductor device shown in FIG. 5B is the same or substantially the same as the method for manufacturing the semiconductor device which is shown in FIGS. 2A to 2D and FIGS. 3A to 3C, except the following.

A conductive film is formed over the gate insulating film 108 and the oxide semiconductor film 110 and is subjected to a photolithography step and an etching step, whereby the source electrode 114a and the drain electrode 114b which are electrically connected to the oxide semiconductor film 110 are formed. At this stage, the transistor 170 is formed.

A method for manufacturing the semiconductor device shown in FIG. 5C is the same or substantially the same as the method for manufacturing the semiconductor device shown in FIG. 5B, except the following After a conductive film is formed over the substrate 102, the gate electrode 106 is formed by a photolithography step and an etching step. Then, the first gate insulating film 108a is formed using metal oxide over the gate electrode 106 and the substrate 102. Then, the second gate insulating film 108b is formed over the first gate insulating film 108a. Note that the first gate insulating film 108*a* may be formed using a film and a method which are the same or substantially the same as those of the base insulating film 104 shown in FIG. 4B. The second gate insulating film 108*b* may be formed using a film and a method which are the same or substantially the same as those of the gate insulating film 108 shown in FIG. 4B.

Example 1

In this example, an aluminum oxide film was evaluated; the aluminum oxide film is one example of a base insulating film formed using metal oxide which can be used for a semiconductor device according to one embodiment of the present invention. Evaluation methods and evaluation results thereof are described with reference to FIGS. 6A and 6B and FIG. 7. Note that as the evaluation methods, x-ray reflection (XRR; hereinafter XRR measurement) and secondary ion mass spectrometry (SIMS; hereinafter SIMS analysis) were used.

First, XRR measurement is described below.

XRR is a measurement method for measuring the density of a thin film in a sample, in which X-rays are incident on the thin film to measure critical angles and changes in amplitude waveforms of the incident X-rays and theoretical analysis is performed using the critical angles, the amplitude waveforms, and the like. In this example, an aluminum oxide film having an ideal composition of $Al_2O_3$ (Z/A=0.4882 (Z=atomic number, A=mass number)) was used as a model for theoretical analysis.

Figure 6A:
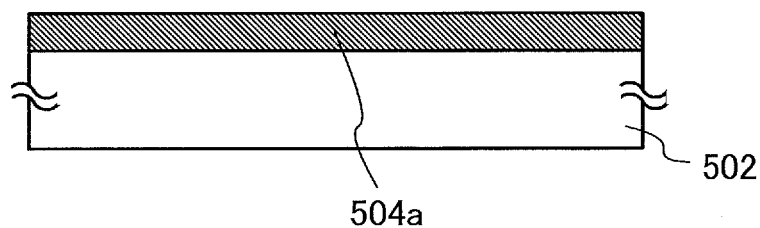
FIG. 6A is a cross-sectional view showing Sample 1 of Example 1.
Figure 6B:
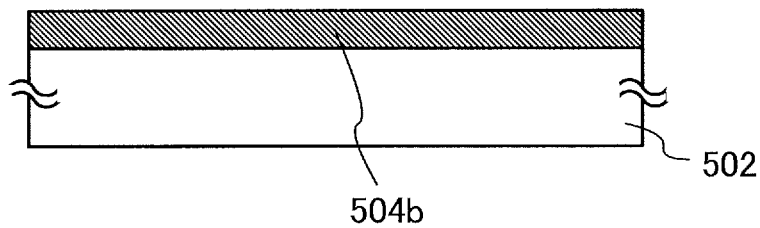
FIG. 6B is a cross-sectional view showing Sample 2 of Example 1.

As samples to be measured by XRR, Sample 1 shown in FIG. 6A and Sample 2 shown in FIG. 6B were used. Details of structures and formation conditions of the samples are described below.

Sample 1

An aluminum oxide film 504*a* was formed over a glass substrate 502 using a sputtering apparatus. The film formation conditions were as follows: the substrate temperature was room temperature; the $O_2$ flow rate ($O_2$=100%) was 50 sccm; the power (pulsed DC power source, pulse=300 kHz) was 6 kW; and the pressure was 0.6 Pa. Note that the film thickness was 100 nm. An aluminum target was used as a sputtering target.

Sample 2

An aluminum oxide film 504*b* was formed over a glass substrate 502 using a sputtering apparatus. The film formation conditions were as follows: the substrate temperature was 150° C.; the $O_2$ flow rate ($O_2$=100%) was 300 sccm; the power (AC power source) was 30 kW; and the pressure was 0.7 Pa. Note that the film thickness was 100 nm. An aluminum target was used as a sputtering target.

Next, the density of the aluminum oxide film of each of Samples 1 and 2 was measured by XRR and evaluated. Note that in XRR, each of samples was measured at three points on plane. A result thereof is shown in FIG. 7.

Figure 7:
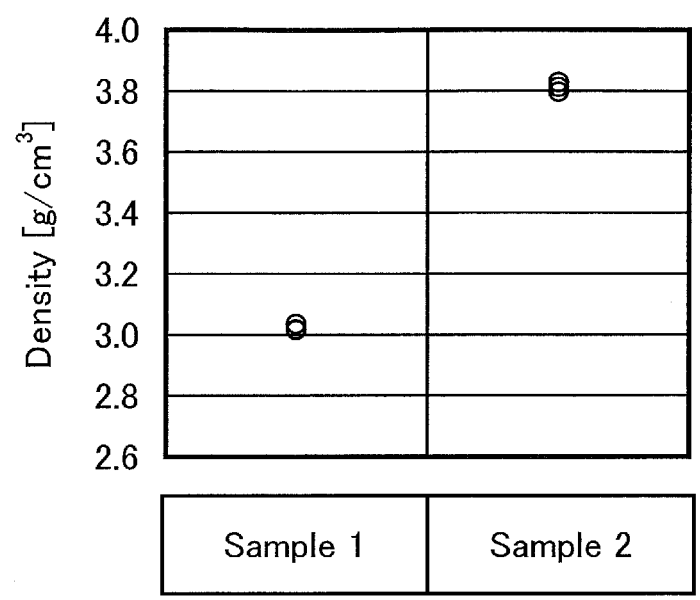
FIG. 7 shows the result of measuring the density of aluminum oxide films of Sample 1 and Sample 2.

As shown in FIG. 7, the aluminum oxide film of Sample 1 had a film density of about 3.0 g/cm$^3$, and the aluminum oxide film of Sample 2 had a film density of about 3.8 g/cm$^3$.

Next, SIMS analysis is described below.

Figure 8A:
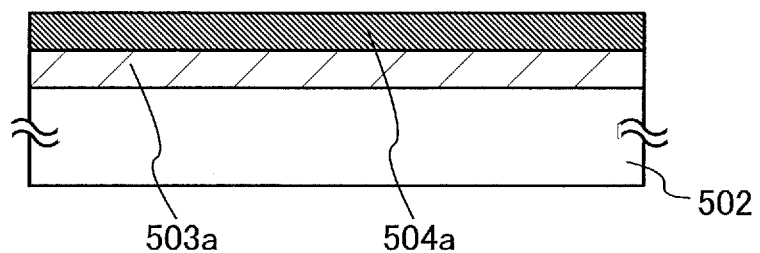
FIG. 8A is a cross-sectional view showing Sample 3 of Example 1.
Figure 8B:
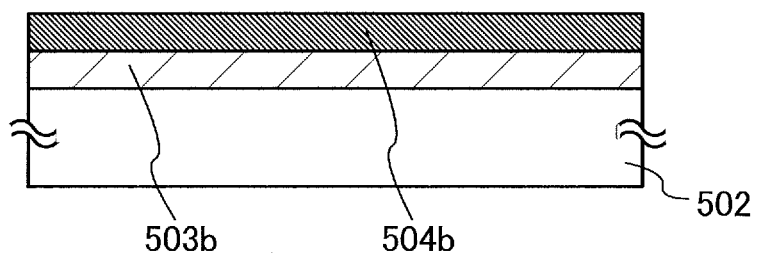
FIG. 8B is a cross-sectional view showing Sample 4 of Example 1.

As samples for SIMS analysis, Sample 3 shown in FIG. 8A and Sample 4 shown in FIG. 8B were used. Details of structures and formation conditions of the samples are described below.

Sample 3

A silicon oxide film 503*a* was formed over a glass substrate 502 using a sputtering apparatus. An aluminum oxide film 504*a* was formed over the silicon oxide film 503*a* using a sputtering apparatus. The film formation conditions of the silicon oxide film 503*a* were as follows: the substrate temperature was 200° C.; the $O_2$ flow rate ($O_2$=100%) was 300 sccm; the power (pulsed DC power source, pulse=300 kHz) was 6 kW; and the pressure was 0.4 Pa. Note that the film thickness was 100 nm. The film formation conditions of the aluminum oxide film 504*a* were the same or substantially the same as those of Sample 1; the thus obtained aluminum oxide film 504*a* is estimated to have a film density of 3.0 g/cm$^3$. Note that the film thickness of the aluminum oxide film 504*a* was 50 nm.

Sample 4

A silicon oxide film 503*b* was formed over a glass substrate 502 using a sputtering apparatus. An aluminum oxide film 504*b* was formed over the silicon oxide film 503*b* using a sputtering apparatus. The film formation conditions of the silicon oxide film 503*b* were as follows: the substrate temperature was 200° C.; the $O_2$ flow rate ($O_2$=100%) was 300 sccm; the power (pulsed DC power source, pulse=300 kHz) was 6 kW; and the pressure was 0.4 Pa. Note that the film thickness was 400 nm. The film formation conditions of the aluminum oxide film 504*b* were the same or substantially the same as those of Sample 2; the thus obtained aluminum oxide film 504*b* is estimated to have a film density of 3.0 g/cm$^3$.

Next, a pressure cooker test (PCT; hereinafter referred to as PCT) was performed on Samples 3 and 4.

In PCT in this example, Samples 3 and 4 were held for 100 hours under the following conditions: the temperature was 130° C.; the humidity was 85%; the atmosphere was such that $H_2O$ (water):$D_2O$ (deuterated water)=3:1 (in volume ratio); and the pressure was 2.3 atm (0.23 MPa).

Figure 9:
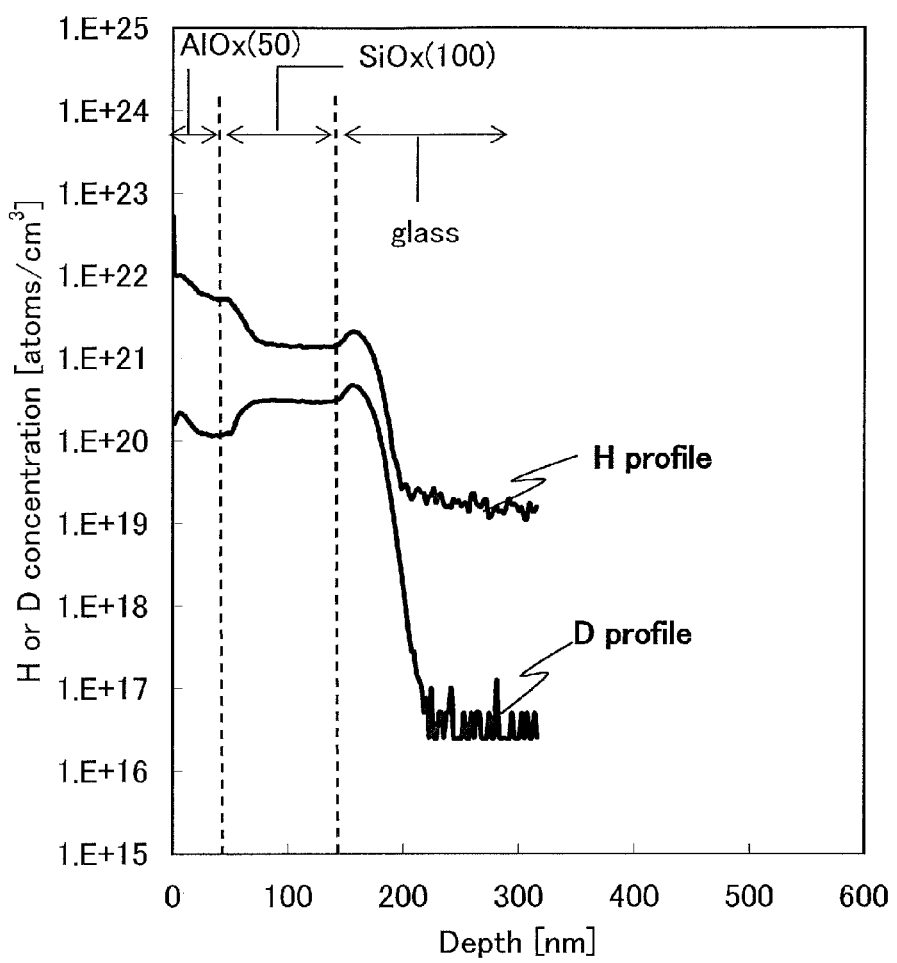
FIG. 9 shows the result of measuring the concentrations of hydrogen atoms and deuterium atoms in films of Sample 3.
Figure 10:
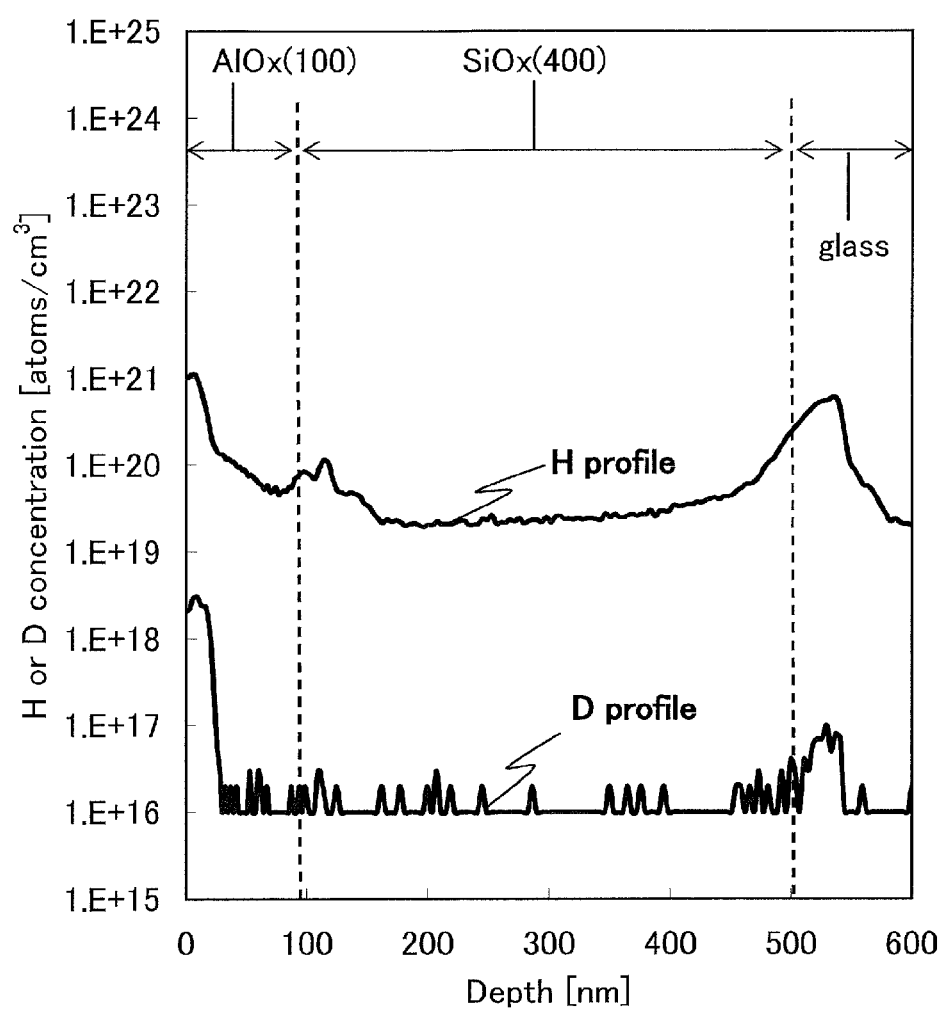
FIG. 10 shows the result of measuring the concentrations of hydrogen atoms and deuterium atoms in films of Sample 4.

Next, SIMS analysis was performed on Samples 3 and 4 after the PCT to measure the concentrations of hydrogen (H) atoms and deuterium (D) atoms in the films. The evaluation result of Sample 3 is shown in FIG. 9, and the evaluation result of Sample 4 is shown in FIG. 10. Note that the results of SIMS analysis in this example were quantified using a standard sample of a silicon oxide film.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) atoms and deuterium (D) atoms in the film are analyzed by SIMS, an average value in a region where the film is provided, the value is not greatly changed, and an almost constant level of strength can be obtained is employed as measured concentrations.

FIG. 9 shows that the concentration of hydrogen (H) atoms in the silicon oxide film 503*a* of Sample 3 was $1.4 \times 10^{21}$ atoms/cm$^3$ and the concentration of deuterium (D) atoms in the silicon oxide film 503*a* of Sample 3 was $2.9 \times 10^{20}$ atoms/cm$^3$. FIG. 10 shows that the concentration of hydrogen (H) atoms in the silicon oxide film 503*b* of Sample 4 was $2.2 \times 10^{19}$ atoms/cm$^3$ and the concentration of deuterium (D) atoms in the silicon oxide film 503*b* of Sample 4 was lower than or equal to a lower limit of detection. Note that the lower limit of detection of the concentration of deuterium (D) atoms by SIMS analysis in this example is $1.0 \times 10^{16}$ atoms/cm$^3$.

Thus, it can be said that, in Sample 3 including the aluminum oxide film 504*a* having a film density of about 3.0 g/cm$^3$, hydrogen (H) atoms and deuterium (D) atoms are diffused into the aluminum oxide film 504*a* and the silicon oxide film 503*a*. On the other hand, in Sample 4 including the aluminum oxide film 504b having a film density of about 3.8 g/cm³, the concentrations of hydrogen (H) atoms and deuterium (D) atoms drastically decrease at a depth of around 30 nm in the aluminum oxide film 504b; therefore, it can be said that hydrogen (H) atoms and deuterium (D) atoms are not diffused into the aluminum oxide film 504b and the silicon oxide film 504b.

As described above, it is found that the aluminum oxide films vary in barrier property with respect to impurities (hydrogen and deuterium) depending on the film densities of the aluminum oxide films.

Example 2

In this example, a base insulating film was evaluated; the base insulating film was formed using metal oxide which could be used for a semiconductor device according to one embodiment of the present invention.

As an evaluation method, thermal desorption spectroscopy (TDS; hereinafter TDS analysis) was used.

The following are three kinds of samples manufactured for the evaluation: a silicon nitride film (SiN) as Sample 5; a silicon oxynitride film (SiON) as Sample 6; and an aluminum oxide film ($AlO_x$) as Sample 7.

Details of structures and film formation conditions of the samples are described below.

Sample 5

A silicon nitride film (SiN) was formed over a glass substrate using a PE-CVD apparatus. The film formation conditions were as follows: the gas flow rate was such that $SiH_4$/$N_2$/$NH_3$=90 sccm/4000 sccm/2700 sccm; the film formation power was 2000 W (RF); the film formation pressure was 200 Pa; and the substrate temperature was 350° C. Note that the thickness of the glass substrate was 0.7 mm and the film thickness of the silicon nitride film (SiN) was 100 nm.

Sample 6

A silicon oxynitride film (SiON) was formed over a glass substrate using a PE-CVD apparatus. The film formation conditions were as follows: the gas flow rate was such that $SiH_4$/$N_2O$=20 sccm/3000 sccm; the film formation power was 100 W (RF); the film formation pressure was 40 Pa; and the substrate temperature was 350° C. Note that the thickness of the glass substrate was 0.7 mm and the thickness of the silicon oxynitride film (SiON) was 100 nm.

Sample 7

An aluminum oxide film ($AlO_x$) was formed over a glass substrate using a sputtering apparatus. The film formation conditions were as follows: the $O_2$ flow rate ($O_2$=100%) was 300 sccm; the film formation power was 30 kW (AC); the film formation pressure was 0.7 Pa; and the substrate temperature was room temperature (R.T.). Note that the thickness of the glass substrate was 0.7 mm and the film thickness of the aluminum oxide film ($AlO_x$) was 100 nm.

Next, TDS analysis was performed on Samples 5 to 7. Note that TDS analysis is an analysis method in which each sample is heated in a vacuum case and a gas component generated from each sample when the temperature of the sample is increased is detected by a quadrupole mass spectrometer. Detected gas components are distinguished from each other by the ionic strength of m/z (mass/charge). Note that in this example, a component having the ionic strength of m/z=2 was identified as hydrogen ($H_2$) and a component having the ionic strength of m/z=18 was identified as water ($H_2O$).

Figures 11A, 11B:
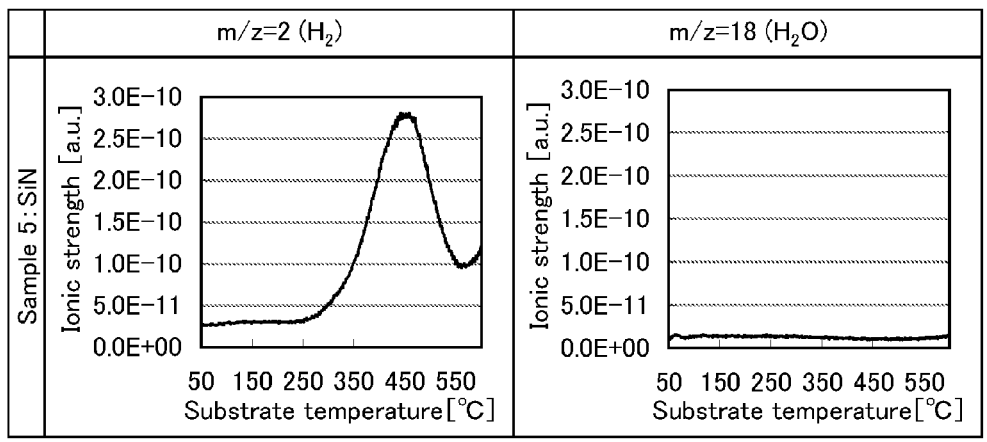
FIGS. 11A and 11B show the results of TDS measurement of Sample 5 of Example 2.
Figures 11C, 11D:
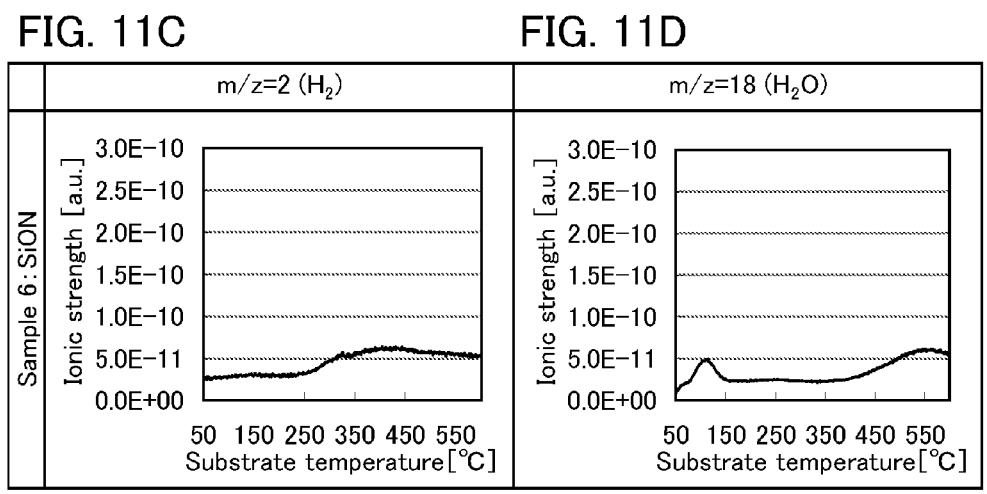
FIGS. 11C and 11D show the results of TDS measurement of Sample 6 of Example 2.
Figures 11E, 11F:
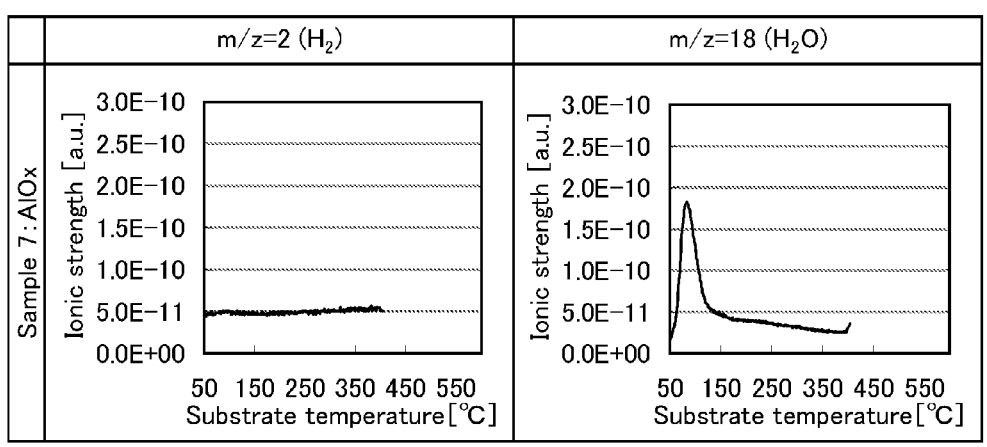
FIGS. 11E and 11F show results of TDS measurement of Sample 7 of Example 2.

FIGS. 11A and 11B show the results of TDS measurement of the silicon nitride film (SiN) of Sample 5. FIGS. 11C and 11D show the results of TDS measurement of the silicon oxynitride film (SiON) of Sample 6. FIGS. 11E and 11F show the results of TDS measurement of the aluminum oxide film ($AlO_x$) of Sample 7. FIGS. 11A, 11C, and 11E show the results of TDS measurement with respect to m/z=2 ($H_2$). FIGS. 11B, 11D, and 11F show the results of TDS measurement with respect to m/z=18 ($H_2O$). Note that in each of FIGS. 11A to 11F, the horizontal axis represents substrate temperature (° C.), and the vertical axis represents the ionic strength (arbitrary unit) of m/z=2 ($H_2$) or m/z=18 ($H_2O$).

As shown in FIGS. 11A and 11B, as for the silicon nitride film (SiN) of Sample 5, the ionic strength of m/z=2 ($H_2$) is remarkably detected in a range of 300° C. to 550° C. while the ionic strength of m/z=18 ($H_2O$) is less detected.

Further, as shown in FIGS. 11C and 11D, as for the silicon oxynitride film (SiON) of Sample 6, the ionic strength of m/z=2 ($H_2$) is detected at temperatures from around 300° C., and the ionic strength of m/z=18 ($H_2O$) is also detected at temperatures from around 400° C. Note that the ionic strength of m/z=18 ($H_2O$) which is detected at around 100° C. is probably due to adsorbed water on a surface of the sample.

As shown in FIGS. 11E and 11F, as for the aluminum oxide film ($AlO_x$) of Sample 7, the ionic strength of m/z=2 ($H_2$) and the ionic strength of m/z=18 ($H_2O$) are hardly detected. Note that the ionic strength of m/z=18 ($H_2O$) which is detected at around 100° C. is probably due to adsorbed water on a surface of the sample.

Here, the ionic strength of m/z=2 ($H_2$) and the ionic strength of m/z=18 ($H_2O$) of each sample were quantified to calculate the amount of hydrogen ($H_2$) released and the amount of water ($H_2O$) released from each sample. Since the ionic strength of m/z=18 ($H_2O$) at around 100° C. is probably due to adsorbed water on a surface of each sample, the ionic strength at around 100° C. is not quantified. Note that it was difficult to quantify the ionic strength of the samples in each of which the amount of ionic strength detected is small; therefore, such ionic strength was regarded as being unquantifiable. Table 1 shows conditions (film type, deposition apparatus, power source, and substrate temperature) of each sample, the amount of released hydrogen ($H_2$), and the amount of released water ($H_2O$).

TABLE 1

|  | Film type | Deposition apparatus | Power source | Substrate temperature [° C.] | Amount of released hydrogen ($H_2$) [atoms/cm³] | Amount of released water ($H_2O$) [atoms/cm³] |
| --- | --- | --- | --- | --- | --- | --- |
| Sample 5 | Silicon nitride film | PE-CVD apparatus | RF | 350 | 4.75E+15 | Unquantifiable |
| Sample 6 | Silicon oxynitride film | PE-CVD apparatus | RF | 350 | 8.16E+14 | 2.87E+15 |
| Sample 7 | Aluminum oxide film | Sputtering apparatus | AC | R.T. | Unquantifiable | Unquantifiable |

As a result of the quantification, the amount of hydrogen ($H_2$) released from the silicon nitride film (SiN) of Sample 5 was $4.75 \times 10^{15}$ atoms/cm³, and the amount of water ($H_2O$) released from the silicon nitride film (SiN) of Sample 5 was unquantifiable. The amount of hydrogen ($H_2$) released from the silicon oxynitride film (SiON) of Sample 6 was $8.16 \times 10^{14}$ atoms/cm³, and the amount of water ($H_2O$) released from the silicon oxynitride film (SiON) of Sample 6 was $2.87 \times 10^{15}$ atoms/cm³. The amount of hydrogen ($H_2$) released from the aluminum oxide film ($AlO_x$) of Sample 7 and the amount of water ($H_2O$) released from the aluminum oxide film ($AlO_x$) of Sample 7 were unquantifiable.

As described above, it is found that hydrogen or water is released from the silicon nitride film and the silicon oxynitride film. On the other hand, hydrogen and water are hardly released from the aluminum oxide film. Therefore, when the amount of hydrogen ($H_2$) released and the amount of water ($H_2O$) released from the aluminum oxide film are each less than or equal to $1.0 \times 10^{15}$ atoms/cm³, the use of such an aluminum oxide film for the base insulating film can prevent hydrogen and water as impurities from being diffused into the oxide semiconductor film.

Example 3

In this example, a transistor 180 having a structure including a base insulating film formed using a metal oxide film was manufactured, a transistor 190 having a structure without a base insulating film was manufactured as a comparison example, and the reliability of each transistor was evaluated. The structures of the transistors of this example and the comparison example, and the results of evaluating reliability of the transistors are described with reference to FIGS. 12A and 12B, FIGS. 13A and 13B, FIGS. 14A and 14B, FIGS. 15A and 15B, and FIGS. 16A and 16B.

Figure 12A:
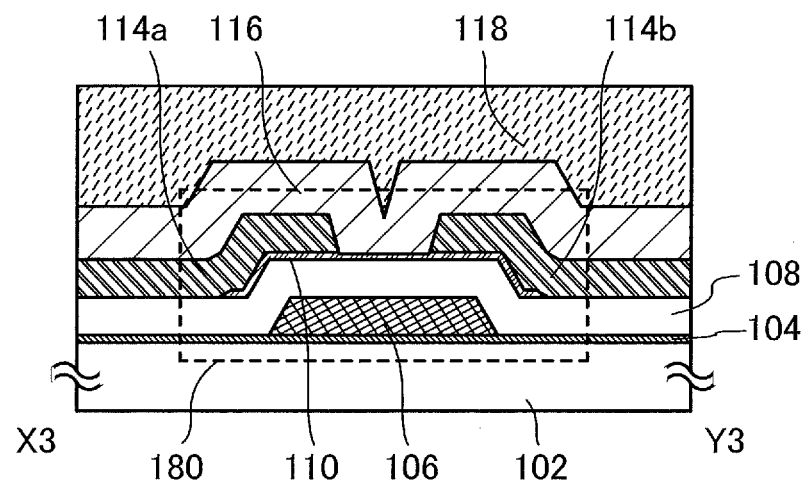
FIG. 12A is a cross-sectional view showing a transistor 180 of Example 3.

FIG. 12A shows the structural view of the transistor 180 manufactured in this example. In the transistor 180, a glass substrate was used for a substrate 102; an aluminum oxide film (thickness: 30 nm) which is estimated to have a film density of about 3.8 g/cm³ was used for a base insulating film 104; a tungsten film (thickness: 100 nm) was used for a gate electrode 106; a silicon oxynitride film (thickness: 200 nm) was used for a gate insulating film 108; an oxide semiconductor film (thickness: 35 nm) of In:Ga:Zn=1:1:1 (in atomic ratio) was used for an oxide semiconductor film 110; a stack film including a titanium film (thickness: 100 nm), an aluminum film (thickness: 400 nm), and a titanium film (thickness: 100 nm) was used for a source electrode 114a and a drain electrode 114b; a silicon oxide film (thickness: 400 nm) formed by a sputtering method was used for an interlayer insulating film 116; and acrylic resin (thickness: 1.5 μm) was used for a planarization insulating film 118. Note that the transistor 180 has a channel length (L) of 6 μm and a channel width (W) of 50 μm.

Figure 12B:
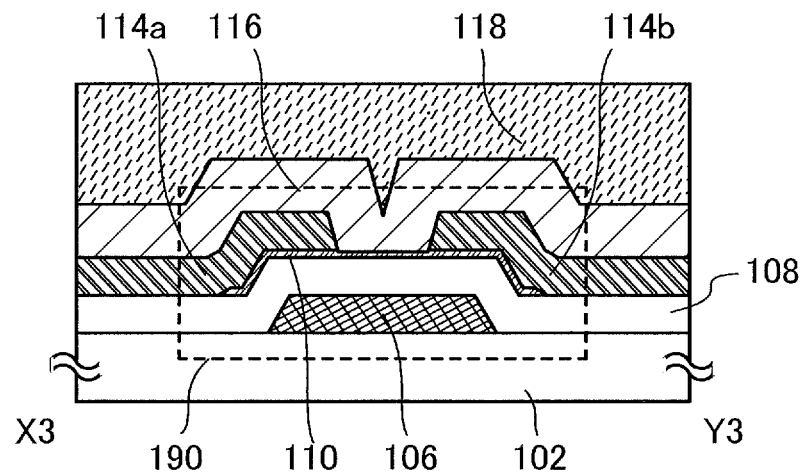
FIG. 12B is a cross-sectional view showing a transistor 190 of a comparison example.

FIG. 12B shows the structural view of the transistor 190 of the comparison example. In the transistor 190, a substrate 102, a gate electrode 106, a gate insulating film 108, an oxide semiconductor film 110, a source electrode 114a, a drain electrode 114b, an interlayer insulating film 116, a planarization insulating film 118, a channel length (L), and a channel width (W) were the same or substantially the same as those in the transistor 180 of this example. That is, the transistor 190 of the comparison example is the same or substantially the same as the transistor 180 of this example from which the base insulating film 104 is omitted.

Next, the transistor 180 of this example and the transistor 190 of the comparison example were subjected to a reliability test. As the reliability test, a gate BT (voltage-heat) stress test was employed.

As the gate BT stress test, four conditions were employed. Details of each condition are described below.
(Condition 1: dark environment, positive BT test)
Vg=+30 V, Vd=0 V, Vs=0 V, stress temperature=80° C., stress application time=0 sec, 500 sec, and 1000 sec, no light emission.
(Condition 2: dark environment, negative BT test)
Vg=−30 V, Vd=0 V, Vs=0 V, stress temperature=80° C., stress application time=0 sec, 500 sec, and 1000 sec, no light emission.
(Condition 3: photo environment, positive BT test)
Vg=+30 V, Vd=0 V, Vs=0 V, stress temperature=80° C., stress application time=0 sec, 500 sec, and 1000 sec, light emission.
(Condition 4: photo environment, negative BT test)
Vg=−30 V, Vd=0 V, Vs=0 V, stress temperature=80° C., stress application time=0 sec, 500 sec, and 1000 sec, light emission.

Note that the light emission in the light environment was performed under a condition that a white LED was used and an illuminance of light was set to about 3000 lux (lx).

Figure 13A:
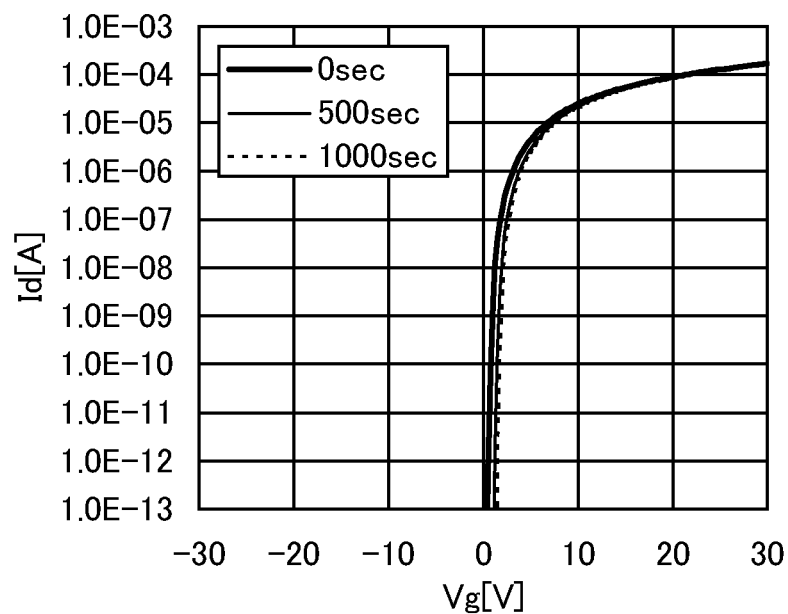
FIG. 13A shows transistor characteristics of the transistor 180 of Example 3 after a test under Condition 1.
Figure 13B:
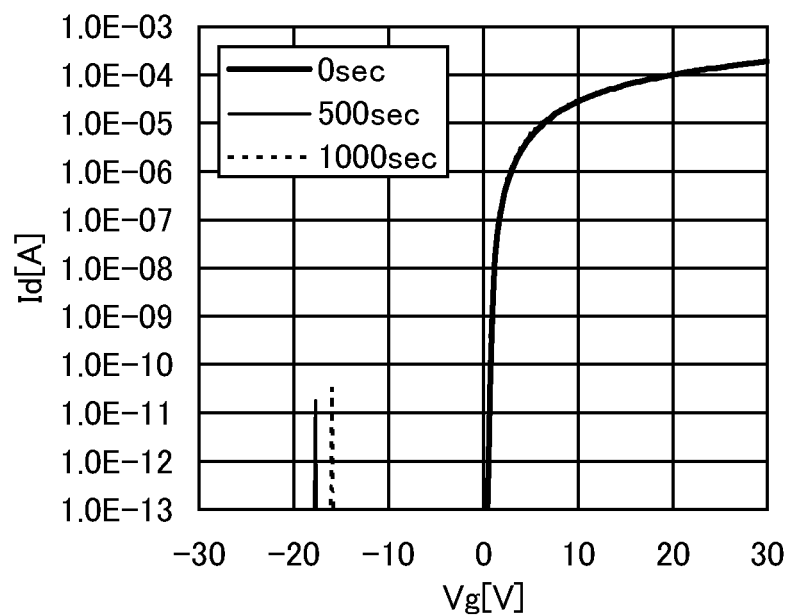
FIG. 13B shows transistor characteristics of a transistor 180 of Example 3 after a test under Condition 2.
Figure 14A:
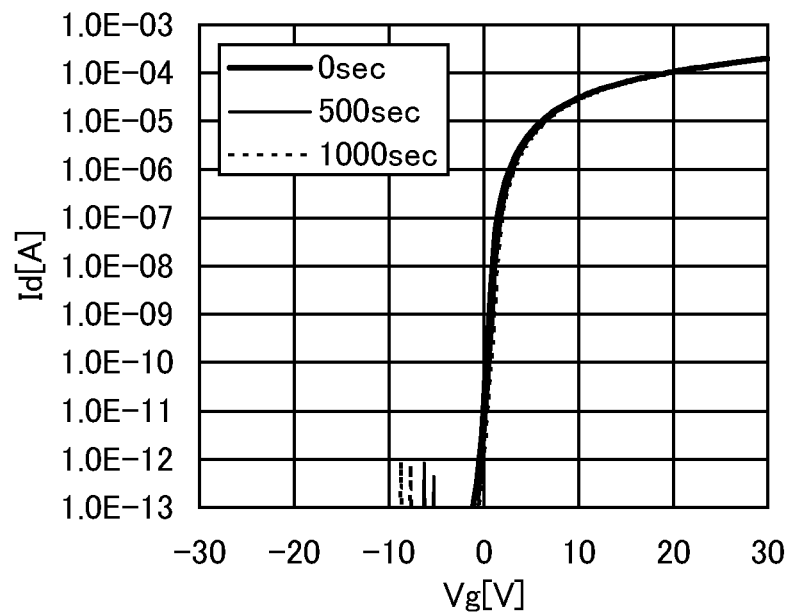
FIG. 14A shows transistor characteristics of a transistor 180 of Example 3 after a test under Condition 3.
Figure 14B:
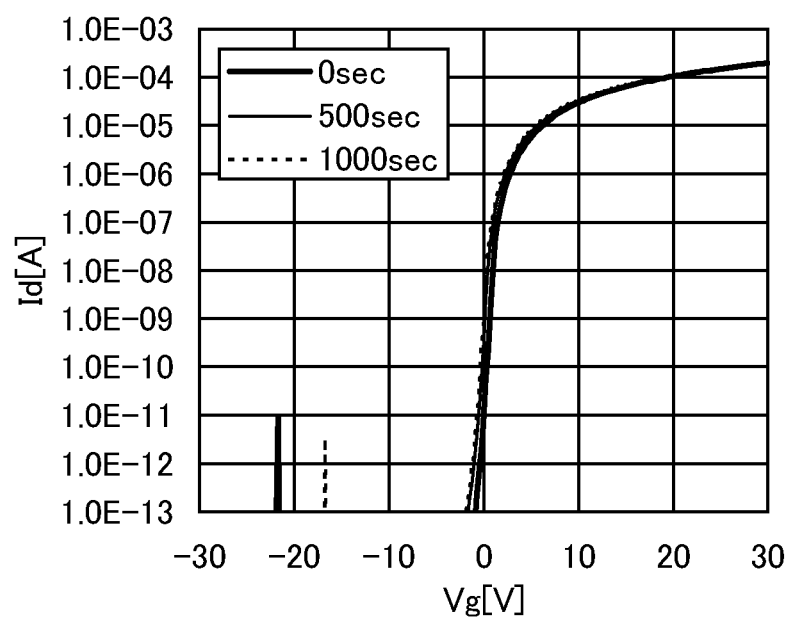
FIG. 14B shows transistor characteristics of a transistor 180 of Example 3 after a test under Condition 4.

FIG. 13A shows the characteristics of the transistor 180 of this example after the test under Condition 1. FIG. 13B shows the characteristics of another transistor 180 of this example after the test under Condition 2. FIG. 14A shows the characteristics of another transistor 180 after the test under Condition 3. FIG. 14B shows the characteristics of another transistor 180 after the test under Condition 4.

Figure 15A:
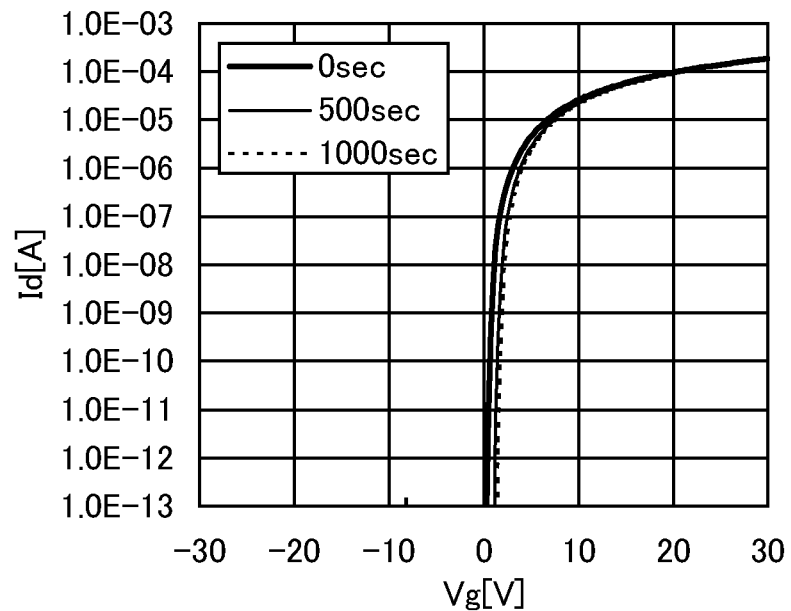
FIG. 15A shows transistor characteristics of the transistor 190 of the comparison example after a test under Condition 1.
Figure 15B:
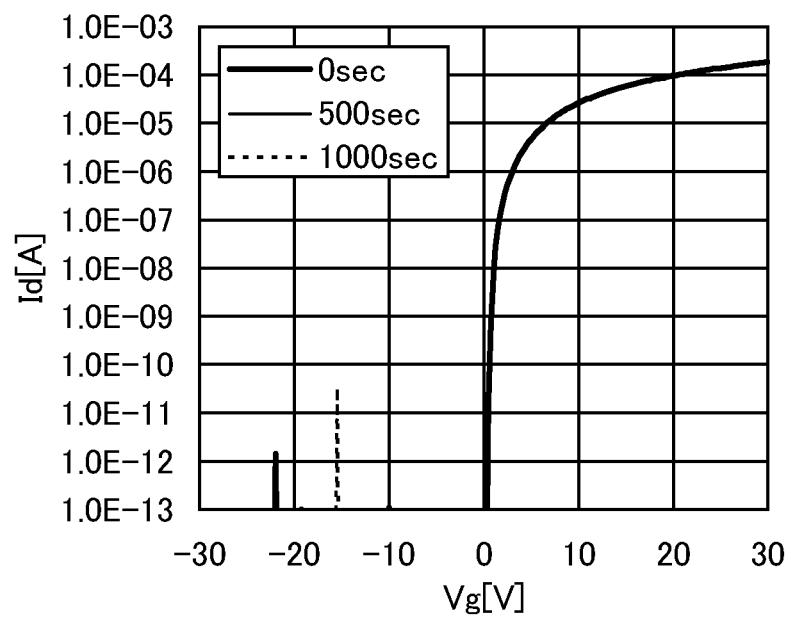
FIG. 15B shows transistor characteristics of a transistor 190 of the comparison example after a test under Condition 2.
Figure 16A:
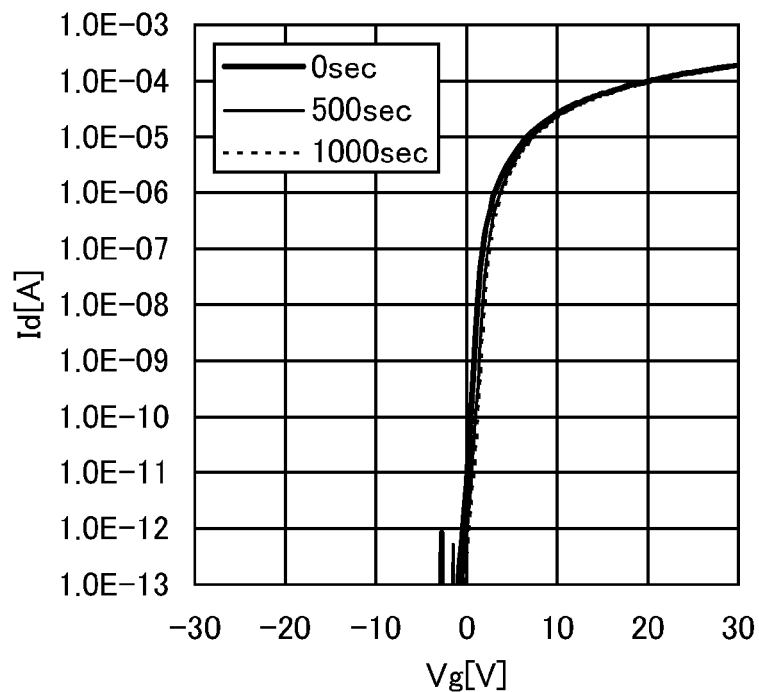
FIG. 16A shows transistor characteristics of a transistor 190 of the comparison example after a test under Condition 3.
Figure 16B:
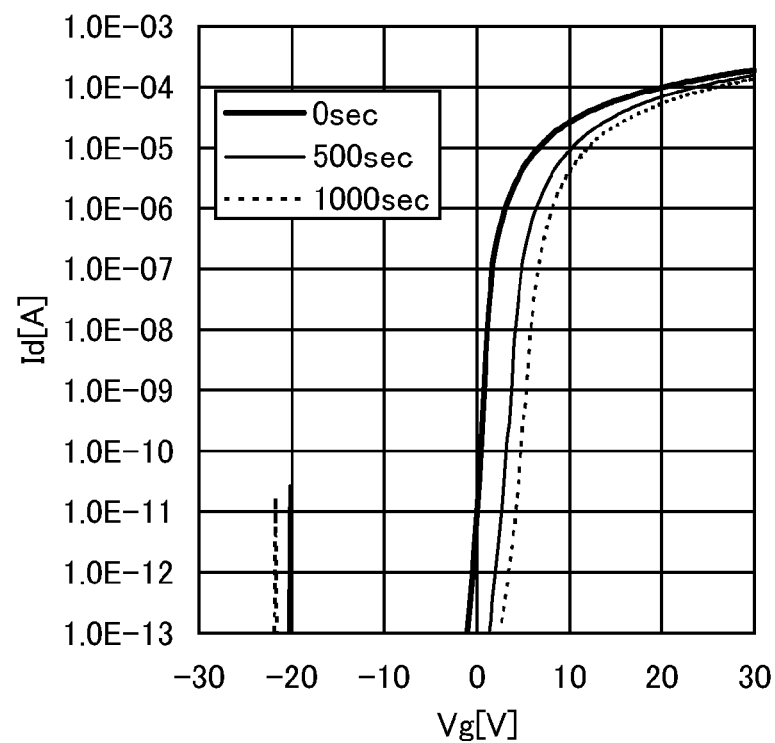
FIG. 16B shows transistor characteristics of a transistor 190 of the comparison example after a test under Condition 4.

FIG. 15A shows the characteristics of the transistor 190 of the comparison example after the test under Condition 1. FIG. 15B shows the characteristics of another transistor 190 of the comparison example after the test under Condition 2. FIG. 16A shows the characteristics of another transistor 190 of the comparison example after the test under Condition 3. FIG. 16B shows the characteristics of another transistor 190 of the comparison example after the test under Condition 4.

FIGS. 13A and 13B, FIGS. 14A and 14B, FIGS. 15A and 15B, and FIGS. 16A and 16B each show a drain current (Id) obtained by changing a gate voltage (Vg) from −25 V to 25 V by 0.25 V when a voltage (Vd) between a source electrode and a drain electrode of the transistor is 10 V. These graphs each show what is called a Vg-Id curve. The horizontal axis represents Vg (V), and the vertical axis represents Id (A).

On each of FIGS. 13A and 13B, FIGS. 14A and 14B, FIGS. 15A and 15B, and FIGS. 16A and 16B, the characteristics of the transistor after 0 sec, 500 sec, and 1000 sec of stress application time are plotted. Note that the stress application time was changed in the following order: 0 sec; 500 sec; and 1000 sec. In the graphs, a bold solid line represents the characteristics after 0 sec, a thin solid line represents the characteristics after 500 sec, and a thin dashed line represents the characteristics after 1000 sec.

As shown in FIGS. 13A and 13B and FIGS. 14A and 14B, the characteristics of the transistor 180 of this example which includes the aluminum oxide film for the base insulating film are less varied through the gate BT stress test under any of Conditions 1 to 4.

As shown in FIGS. 15A and 15B and FIG. 16A, the characteristics of the transistor 190 of the comparison example without a base insulating film are less varied through the gate BT stress test under Conditions 1 to 3. However, as shown in FIG. 16B, the characteristics of the transistor are varied through the gate BT stress test under Condition 4.

As shown above, in the transistor 180 of this example including the aluminum oxide film for the base insulating film 104, reliability of the transistor is improved as compared to the transistor 190 of the comparison example without the base insulating film 104. In particular, reliability of the transistor through the negative BT test in the light environment (Condition 4) is noticeably improved.

Example 4

In this example, samples for impurity analysis are described with reference to FIGS. 17A and 17B. The samples were manufactured using the substrates provided with the transistor 180 and the transistor 190 which are described in Example 3.

Figure 17A:
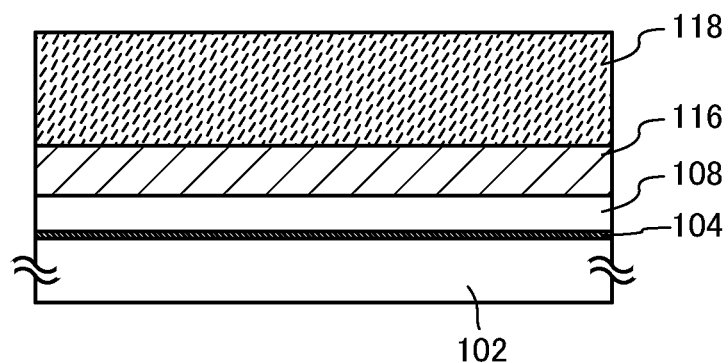
FIG. 17A is a cross-sectional view showing Sample 8 of Example 4.

FIG. 17A shows a sample manufactured over the same substrate as the transistor 180. The sample includes the glass substrate 102, the base insulating film 104 formed over the glass substrate 102, the gate insulating film 108 formed over the base insulating film 104, the interlayer insulating film 116 formed over the gate insulating film 108, and the planarization insulating film 118 formed over the interlayer insulating film 116. Note that the structure shown in FIG. 17A is referred to as Sample 8.

Figure 17B:
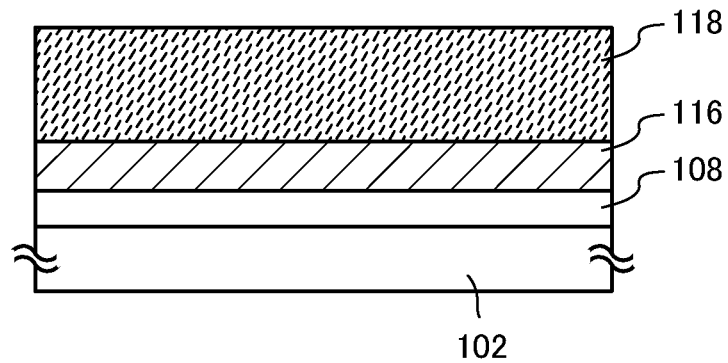
FIG. 17B is a cross-sectional view showing Sample 9 of Example 4.

FIG. 17B shows a sample manufactured over the same substrate as the transistor 190. The sample includes the glass substrate 102, the gate insulating film 108 formed over the glass substrate 102, the interlayer insulating film 116 formed over the gate insulating film 108, and the planarization insulating film 118 formed over the interlayer insulating film 116. Note that the structure shown in FIG. 17B is referred to as Sample 9.

Since the details of each component are the same or substantially the same as those described in Example 3, the detailed description is omitted.

Note that the samples for impurity analysis (Sample 8 and Sample 9) which are shown in FIGS. 17A and 17B are each formed such that the gate electrode 106, the oxide semiconductor film 110, the source electrode 114a, and the drain electrode 114b are removed in forming a transistor. By manufacturing the sample for analysis concurrently with formation of the transistor, an actual effect of an impurity on the transistor can be confirmed.

Figure 18A:
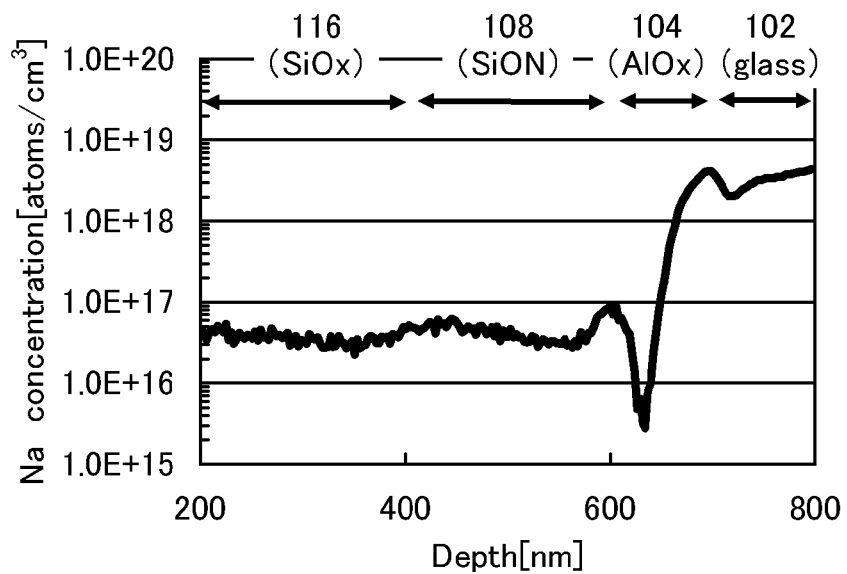
FIG. 18A shows the result of measuring the concentration of sodium in films of Sample 8.
Figure 18B:
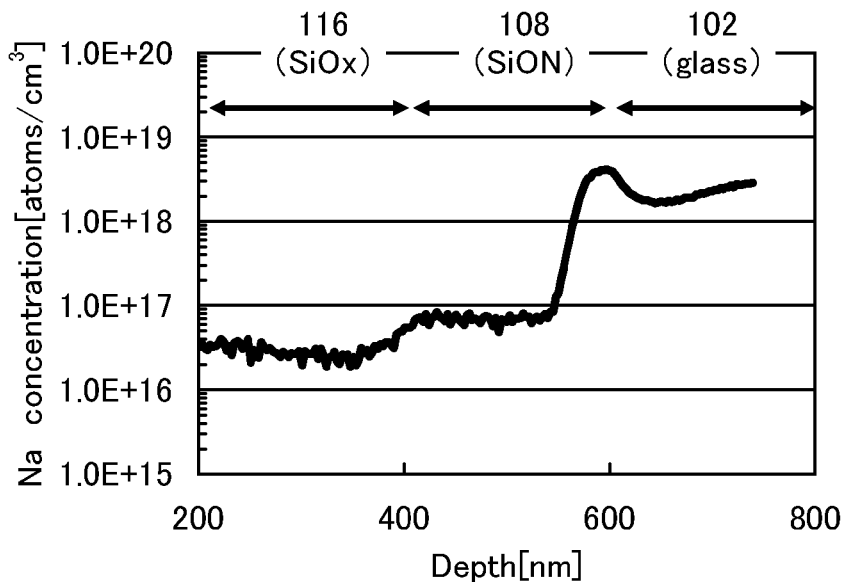
FIG. 18B shows the result of measuring the concentration of sodium in films of Sample 9.

Next, SIMS analysis was performed on Sample 8 and Sample 9, and a metal element contained in the glass substrates was evaluated. In the evaluation, sodium (Na) was focused on as the metal element contained in the glass substrate. FIG. 18A shows the result of SIMS analysis of Sample 8, and FIG. 18B shows the result of SIMS analysis of Sample 9. In the SIMS analysis of this example, an impurity in the vicinity of the glass substrate was evaluated; therefore, an impurity in the interlayer insulating film 118 was not evaluated.

In FIGS. 18A and 18B, the horizontal axis represents depth [nm] and the vertical axis represents sodium (Na) concentration. Note that the results of SIMS analysis in this example were quantified using a standard sample of a silicon oxide film.

As shown in FIG. 18A, aluminum oxide provided as the base insulating film 104 prevents sodium (Na) that is one of metal elements contained in the glass substrate from being diffused into the gate insulating film 108. Further, in a region of the base insulating film 104 which is present in the range of 3 nm or less from a surface of the base insulating film 104, the concentration of sodium (Na) that is one of metal elements contained in the glass substrate is less than or equal to $1 \times 10^{18}$ atoms/cm$^3$.

On the other hand, as shown in FIG. 18B, in the structure without the base insulating film 104, sodium (Na) that is one of metal elements contained in the glass substrate is diffused into the gate insulating film 108.

As described above, by providing an aluminum oxide film as the base insulating film, the metal element contained in the glass substrate can be prevented from being diffused into the gate insulating film.

This application is based on Japanese Patent Application serial no. 2012-045498 filed with Japan Patent Office on Mar. 1, 2012, the entire contents of which are hereby incorporated by reference.

What is claimed is:

1. A semiconductor device comprising:
   a glass substrate containing a metal element;
   an oxide semiconductor film over the glass substrate; and
   an insulating film including metal oxide between the oxide semiconductor film and the glass substrate,
   wherein the insulating film includes a region in a range of 3 nm or less from a top surface of the insulating film, and
   wherein a concentration of the metal element in the region is less than or equal to $1 \times 10^{18}$ atoms/cm$^3$.

2. The semiconductor device according to claim 1, further comprising an oxide insulating film over a channel region of the oxide semiconductor film.

3. The semiconductor device according to claim 1,
   wherein the insulating film is an aluminum oxide film, and
   wherein a density of the aluminum oxide film is 3.2 g/cm$^3$ or more.

4. The semiconductor device according to claim 3,
   wherein an amount of water released from the aluminum oxide film is less than or equal to $1.0 \times 10^{15}$ atoms/cm$^3$.

5. The semiconductor device according to claim 3,
   wherein an amount of hydrogen released from the aluminum oxide film is less than or equal to $1.0 \times 10^{15}$ atoms/cm$^3$.

6. The semiconductor device according to claim 1,
   wherein the oxide semiconductor film is a film containing at least one oxide selected from the group consisting of indium oxide, zinc oxide, gallium oxide, and tin oxide.

7. The semiconductor device according to claim 1,
   wherein the oxide semiconductor film contains a crystal part, and
   wherein, in the crystal part, a c-axis is aligned in a direction parallel to a normal vector of a surface where the oxide semiconductor film is formed.

8. A semiconductor device comprising:
   a glass substrate containing a metal element;
   a base insulating film including metal oxide over the glass substrate;
   a gate electrode over the base insulating film;
   a gate insulating film over the gate electrode;
   an oxide semiconductor film over the gate electrode with the gate insulating film interposed therebetween; and
   a source electrode and a drain electrode which are electrically connected to the oxide semiconductor film,
   wherein the base insulating film includes a region in a range of 3 nm or less from a top surface of the base insulating film, and
   wherein a concentration of the metal element in the region is less than or equal to $1 \times 10^{18}$ atoms/cm$^3$.

9. The semiconductor device according to claim 8, further comprising an oxide insulating film over a channel region of the oxide semiconductor film.

10. The semiconductor device according to claim 8,
    wherein the base insulating film is an aluminum oxide film, and
    wherein a density of the aluminum oxide film is 3.2 g/cm$^3$ or more.

11. The semiconductor device according to claim 10,
wherein an amount of water released from the aluminum oxide film is less than or equal to $1.0 \times 10^{15}$ atoms/cm$^3$.

12. The semiconductor device according to claim 10,
wherein an amount of hydrogen released from the aluminum oxide film is less than or equal to $1.0 \times 10^{15}$ atoms/cm$^3$.

13. The semiconductor device according to claim 8,
wherein the oxide semiconductor film is a film containing at least one oxide selected from the group consisting of indium oxide, zinc oxide, gallium oxide, and tin oxide.

14. The semiconductor device according to claim 8,
wherein the oxide semiconductor film contains a crystal part, and
wherein, in the crystal part, a c-axis is aligned in a direction parallel to a normal vector of a surface where the oxide semiconductor film is formed.

15. A semiconductor device comprising:
a glass substrate containing a metal element;
a gate electrode formed over the glass substrate;
a first gate insulating film including metal oxide over the gate electrode;
a second gate insulating film over the first gate insulating film, the second gate insulating film having a different composition from the first gate insulating film;
an oxide semiconductor film over the gate electrode with the first gate insulating film and the second gate insulating film interposed therebetween; and
a source electrode and a drain electrode which are electrically connected to the oxide semiconductor film,
wherein the first gate insulating film includes a region in a range of 3 nm or less from a top surface of the first gate insulating film, and
wherein a concentration of the metal element in the region is less than or equal to $1 \times 10^{18}$ atoms/cm$^3$.

16. The semiconductor device according to claim 15, further comprising an oxide insulating film over a channel region of the oxide semiconductor film.

17. The semiconductor device according to claim 15,
wherein the first gate insulating film is an aluminum oxide film, and
wherein a density of the aluminum oxide film is 3.2 g/cm$^3$ or more.

18. The semiconductor device according to claim 17,
wherein an amount of water released from the aluminum oxide film is less than or equal to $1.0 \times 10^{15}$ atoms/cm$^3$.

19. The semiconductor device according to claim 17,
wherein an amount of hydrogen released from the aluminum oxide film is less than or equal to $1.0 \times 10^{15}$ atoms/cm$^3$.

20. The semiconductor device according to claim 15,
wherein the oxide semiconductor film is a film containing at least one oxide selected from the group consisting of indium oxide, zinc oxide, gallium oxide, and tin oxide.

21. The semiconductor device according to claim 15,
wherein the oxide semiconductor film contains a crystal part, and
wherein, in the crystal part, a c-axis is aligned in a direction parallel to a normal vector of a surface where the oxide semiconductor film is formed.

* * * * *